(12) United States Patent
Maeno

(10) Patent No.: US 8,957,718 B2
(45) Date of Patent: Feb. 17, 2015

(54) FLIP-FLOP CIRCUIT

(71) Applicant: Kabushiki Kaisha Toshiba, Minato-Ku, Tokyo (JP)

(72) Inventor: Muneaki Maeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/953,491

(22) Filed: Jul. 29, 2013

(65) Prior Publication Data

US 2014/0225657 A1 Aug. 14, 2014

(30) Foreign Application Priority Data

Feb. 13, 2013 (JP) .................................. 2013-025558

(51) Int. Cl.
*H03K 3/3562* (2006.01)
*H03K 3/012* (2006.01)

(52) U.S. Cl.
CPC ............ *H03K 3/012* (2013.01); *H03K 3/35625* (2013.01)
USPC ........... 327/203; 327/202; 327/210; 327/212; 327/218; 326/95; 326/98

(58) Field of Classification Search
USPC ......... 327/202, 203, 208, 210–212, 214, 218; 326/93, 95–98
See application file for complete search history.

(56) References Cited

U.S. PATENT DOCUMENTS

| | | |
|---|---|---|
| 4,841,168 A | 6/1989 | Kubota |
| 5,410,263 A | 4/1995 | Waizman |
| 5,748,487 A | 5/1998 | Sawasaki et al. |
| 6,198,324 B1 | 3/2001 | Schober |
| 6,226,774 B1 | 5/2001 | Sawasaki et al. |
| 6,252,448 B1 | 6/2001 | Schober |
| 6,297,668 B1 | 10/2001 | Schober |
| 6,333,656 B1 | 12/2001 | Schober |
| 6,714,060 B2 | 3/2004 | Araki |
| 7,345,519 B2 | 3/2008 | Hirata |
| 7,495,466 B1 | 2/2009 | Pitkethly et al. |
| 7,872,492 B2 | 1/2011 | Pitkethly et al. |
| 8,274,319 B2 | 9/2012 | Maeno |
| 2012/0194249 A1 | 8/2012 | Haga |
| 2013/0147534 A1 * | 6/2013 | Cheng et al. ................... 327/202 |

FOREIGN PATENT DOCUMENTS

| | | | | |
|---|---|---|---|---|
| JP | 2004064557 A | * | 2/2004 | ........... H03K 3/3562 |
| JP | 2011-171916 A | | 9/2011 | |
| JP | 2011-228944 A | | 11/2011 | |

OTHER PUBLICATIONS

Vyacheslav V. Rovner, Title: "Circuit-Layout Co-optimization for Extremely Regular Design Fabrics in Nanoscale ICs", Dec. 2010.

* cited by examiner

*Primary Examiner* — Patrick O'Neill
(74) *Attorney, Agent, or Firm* — Holtz, Holtz, Goodman & Chick PC

(57) ABSTRACT

A flip-flop circuit has a master latch circuit and a slave latch circuit. In the flip-flop circuit, the master latch circuit and the slave latch circuit share at least a pair of transistors. In response to the clock signal, the signal held in the master latch circuit can be output at higher speed as the output signal via the intermediate node, the slave latch circuit and the output circuit. The flip-flop circuit can be reduced in cell size and improved in processing speed.

20 Claims, 7 Drawing Sheets

FLIP-FLOP CIRCUIT

CROSS-REFERENCE TO RELATED APPLICATION

This application is based upon and claims the benefit of priority from the prior Japanese Patent Application No. 2013-025558, filed on Feb. 13, 2013, the entire contents of which are incorporated herein by reference.

BACKGROUND

1. Field

Embodiments described herein relate to a flip-flop circuit.

2. Background Art

Conventionally, a flip-flop circuit has a type that is configured to be a master latch circuit and a slave latch circuit by using transfer gate and clocked inverter.

Other flip-flop has a type that is configured to be a master latch circuit and a slave latch circuit by using simple gates such as two input NAND circuit or combined gates such as AND-OR circuit.

DETAILED DESCRIPTION

Figure 1:
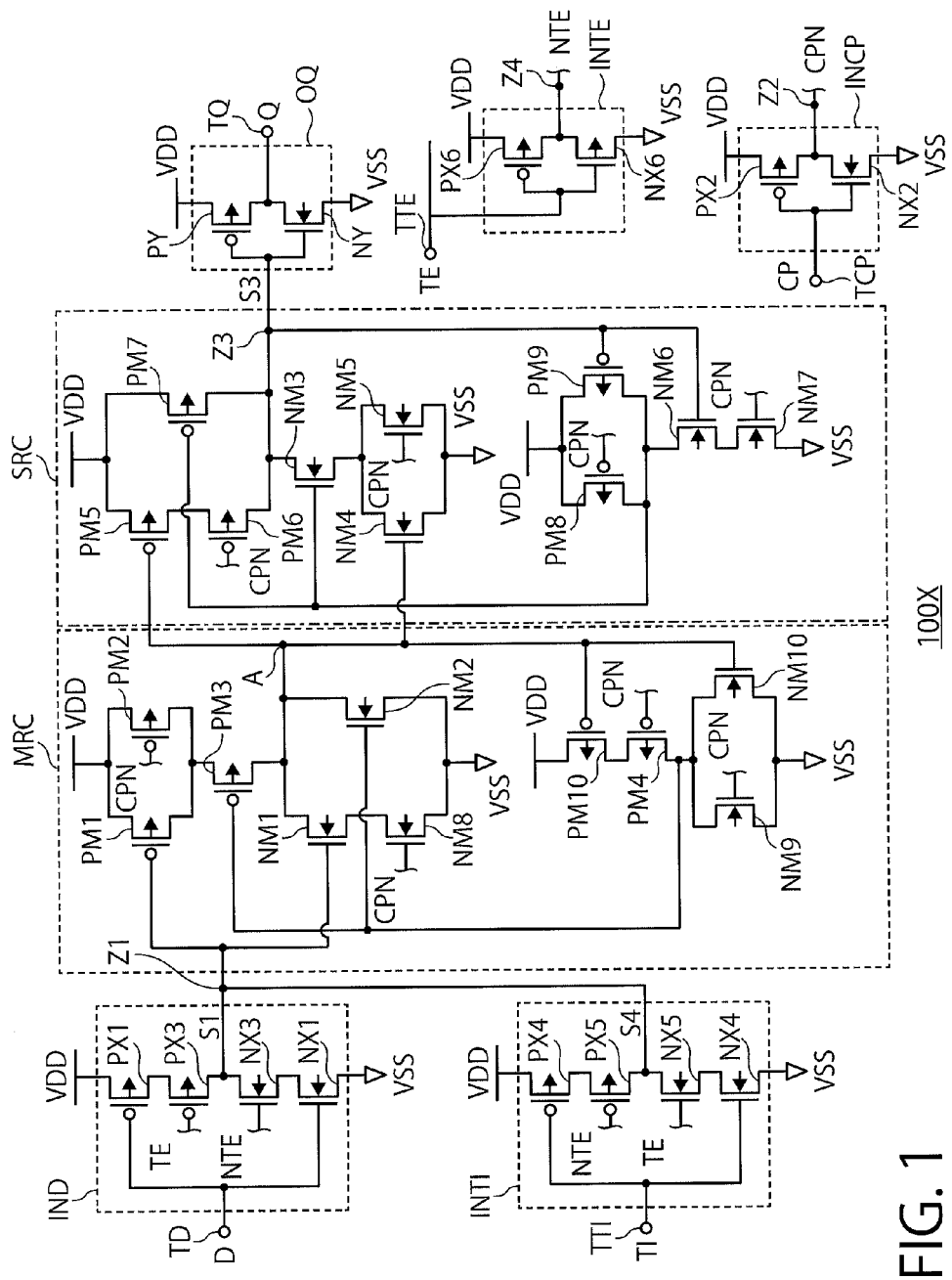
FIG. 1 is a diagram showing an example of a configuration of the flip-flop circuit 100X according to the comparative example.

A flip-flop circuit according to an embodiment includes a first pMOS transistor connected to a power supply at a source thereof and to a first node at a gate thereof, a first signal based on a data signal being supplied to the first node. The flip-flop circuit includes a second pMOS transistor connected to the power supply at a source thereof and to a second node at a gate thereof, a second signal based on a clock signal being supplied to the second node. The flip-flop circuit includes a third pMOS transistor connected to drains of the first and second pMOS transistors at a source thereof and to an intermediate node, at which a master latch and a slave latch are connected to each other, at a drain thereof. The flip-flop circuit includes a first nMOS transistor connected to the intermediate node and the drain of the third pMOS transistor at a drain thereof and to the first node at a gate thereof. The flip-flop circuit includes a second nMOS transistor connected to the intermediate node and the drains of the third pMOS transistor and the first nMOS transistor at a drain thereof, to a ground at a source thereof and to a gate of the third pMOS transistor at a gate thereof. The flip-flop circuit includes a fourth pMOS transistor connected to a gate of the third pMOS transistor and the gate of the second nMOS transistor at a drain thereof and to the second node at a gate thereof. The flip-flop circuit includes a fifth pMOS transistor connected to the power supply at a source thereof and to the intermediate node at a gate thereof. The flip-flop circuit includes a sixth pMOS transistor connected to a drain of the fifth pMOS transistor at a source thereof, to a third node at a drain thereof and to the second node at a gate thereof, an third signal of the slave latch being supplied to the third node. The flip-flop circuit includes a seventh pMOS transistor connected to the power supply at a source thereof and to the third node and the drain of the sixth pMOS transistor at a drain thereof. The flip-flop circuit includes a third nMOS transistor connected to the third node and the drains of the sixth and seventh pMOS transistors at a drain thereof and to a gate of the seventh pMOS transistor at a gate thereof. The flip-flop circuit includes a fourth nMOS transistor connected to a source of the third nMOS transistor at a drain thereof, to the ground at a source thereof and to the intermediate node at a gate thereof. The flip-flop circuit includes a fifth nMOS transistor connected to a source of the third nMOS transistor and the drain of the fourth nMOS transistor at a drain thereof, to the ground at a source thereof and to the second node at a gate thereof. The flip-flop circuit includes an eighth pMOS transistor connected to the power supply at a source thereof, to a gate of the seventh pMOS transistor and the gate of the third nMOS transistor at a drain thereof and to the second node at a gate thereof. The flip-flop circuit includes a ninth pMOS transistor connected to the power supply at a source thereof, to the gates of the seventh pMOS transistor and the third nMOS transistor and the drain of the eighth pMOS transistor at a drain thereof and to the third node at a gate thereof. The flip-flop circuit includes a sixth nMOS transistor connected to the gates of the seventh pMOS transistor and the third nMOS transistor and the drains of the eighth and ninth pMOS transistors at a drain thereof and to the third node at a gate thereof. The flip-flop circuit includes a seventh nMOS transistor connected to a source of the sixth nMOS transistor at a drain thereof, to the ground at a source thereof and to the second node at a gate thereof. The flip-flop circuit output an output signal based on a third signal at the third node. A source of the first nMOS transistor is connected to a source of the sixth nMOS transistor and the drain of the seventh nMOS transistor. A source of the fourth pMOS transistor is connected to a drain of the fifth pMOS transistor and the source of the sixth pMOS transistor. The drain of the fourth pMOS transistor is connected to the gates of the third pMOS transistor and the second nMOS transistor, a source of the third nMOS transistor and the drains of the fourth and fifth nMOS transistors In the following, embodiments will be described with reference to the drawings.

First Embodiment

First, an example of a configuration of a flip-flop circuit 100X according to a comparative example will be described.

FIG. 1 is a diagram showing an example of a configuration of the flip-flop circuit 100X according to the comparative example.

As shown in FIG. 1, the flip-flop circuit 100X includes a master latch circuit "MRC", a slave latch circuit "SRC", a data terminal "TD", a clock terminal "TCP", an output terminal "TQ", a test terminal "TTI", a switching terminal "TTE", a data input circuit "IND", a clock input circuit "INCP", a test input circuit "INTI", a switching input circuit "INTE", and an output circuit "OQ".

The master latch circuit "MRC" has a first pMOS transistor "PM1", a second pMOS transistor "PM2", a third pMOS transistor "PM3", a fourth pMOS transistor "PM4", a tenth pMOS transistor "PM10", a first nMOS transistor "NM1", a second nMOS transistor "NM2", an eighth nMOS transistor "NM8", a ninth nMOS transistor "NM9" and a tenth nMOS transistor "NM10".

Of these MOS transistors, the first pMOS transistor "PM1", the second pMOS transistor "PM2", the third pMOS transistor "PM3", the first nMOS transistor "NM1", the second nMOS transistor "NM2" and the eighth nMOS transistor "NM8" form an AND-OR-Inverter (AOI) circuit of the master latch circuit "MRC", and the fourth pMOS transistor "PM4", the tenth pMOS transistor "PM10", the ninth nMOS transistor "NM9" and the tenth nMOS transistor "NM10" form an NOR circuit.

The slave latch circuit "SRC" has a fifth pMOS transistor "PM5", a sixth pMOS transistor "PM6", a seventh pMOS transistor "PM7", an eighth pMOS transistor "PM8", a ninth pMOS transistor "PM9", a third nMOS transistor "NM3", a fourth nMOS transistor "NM4", a fifth nMOS transistor "NM5", a sixth nMOS transistor "NM6" and a seventh nMOS transistor "NM7".

Of these MOS transistors, the fifth pMOS transistor "PM5", the sixth pMOS transistor "PM6", the seventh pMOS transistor "PM7", the third nMOS transistor "NM3", the fourth nMOS transistor "NM4" and the fifth nMOS transistor "NM5" form an OR-AND-Inverter (OAI) circuit of the slave latch circuit "SRC", and the eighth pMOS transistor "PM8", the ninth pMOS transistor "PM9", the sixth nMOS transistor "NM6" and the seventh nMOS transistor "NM7" form an NAND circuit.

A second signal "CPN" output from the clock input circuit "INCP" is supplied to the master latch circuit "MRC" and the slave latch circuit "SRC".

Now, whether any of the MOS transistors can be shared will be discussed in the context of the operation of the flip-flop circuit 100X according to the comparative example.

For example, if the second signal "CPN" is at a "High" level, and a signal at an intermediate node "A" at which the master latch circuit "MRC" and the slave latch circuit "SRC" are connected each other is at the "High" level, the ninth nMOS transistor "NM9" is turned on, the tenth nMOS transistor "NM10" is turned on, the tenth pMOS transistor "PM10" is turned off, and the fourth pMOS transistor "PM4" is turned off.

As a result, the drains of the ninth nMOS transistor "NM9" and the tenth nMOS transistor "NM10" are set at a "Low" level. At this time, the fourth nMOS transistor "NM4" is turned on, and the fifth nMOS transistor "NM5" is turned on. Therefore, the drains of the fourth nMOS transistor "NM4" and the fifth nMOS transistor "NM5" are set at the "Low" level.

If the second signal "CPN" is at the "High" level, and the signal at the intermediate node "A" is at the "Low" level, the ninth nMOS transistor "NM9" is turned on, the tenth nMOS transistor "NM10" is turned off, the tenth pMOS transistor "PM10" is turned on, and the fourth pMOS transistor "PM4" is turned off.

As a result, the drains of the ninth nMOS transistor "NM9" and the tenth nMOS transistor "NM10" are set at the "Low" level. At this time, the fourth nMOS transistor "NM4" is turned off, and the fifth nMOS transistor "NM5" is turned on. Therefore, the drains of the fourth nMOS transistor "NM4" and the fifth nMOS transistor "NM5" are set at the "Low" level.

If the second signal "CPN" is at the "Low" level, and the signal at the intermediate node "A" is at the "High" level, the ninth nMOS transistor "NM9" is turned off, the tenth nMOS transistor "NM10" is turned on, the tenth pMOS transistor "PM10" is turned off, and the fourth pMOS transistor "PM4" is turned on.

As a result, the drains of the ninth nMOS transistor "NM9" and the tenth nMOS transistor "NM10" are set at the "Low" level.

At this time, the fourth nMOS transistor "NM4" is turned on, and the fifth nMOS transistor "NM5" is turned off. Therefore, the drains of the fourth nMOS transistor "NM4" and the fifth nMOS transistor "NM5" are set at the "Low" level.

If the second signal "CPN" is at the "Low" level, and the signal at the intermediate node "A" is at the "Low" level, the ninth nMOS transistor "NM9" and the tenth nMOS transistor "NM10" are turned off, and the tenth pMOS transistor "PM10" and the fourth pMOS transistor "PM4" are turned on.

As a result, the drains of the ninth nMOS transistor "NM9" and the tenth nMOS transistor "NM10" are set at the "High" level. At this time, the fourth nMOS transistor "NM4" and the fifth nMOS transistor "NM5" are turned off, and the drains of the fourth nMOS transistor "NM4" and the fifth nMOS transistor "NM5" are indeterminate.

However, the fifth pMOS transistor "PM5" and the sixth pMOS transistor "PM6" are turned on. As a result, the drain of the third nMOS transistor "NM3" is set at the "High" level.

Therefore, whether the third nMOS transistor "NM3" is in the on state or in the off state, the source of the third nMOS transistor "NM3" (the drains of the fourth nMOS transistor "NM4" and the fifth nMOS transistor "NM5") can be at the "High" level.

As can be seen from the above description, regardless of the second signal "CPN" or the signal at the intermediate node "A", the drains of the ninth nMOS transistor "NM9" and the tenth nMOS transistor "NM10" and the drains of the fourth nMOS transistor "NM4" and the fifth nMOS transistor "NM5" are in the same state.

Thus, the ninth nMOS transistor "NM9" and the fifth nMOS transistor "NM5" can be shared. Furthermore, the fourth nMOS transistor "NM4" and the tenth nMOS transistor "NM10" can be shared.

Next, both the tenth pMOS transistor "PM10" and the fifth pMOS transistor "PM5" are connected to the intermediate node "A" at the gates thereof and to a power supply "VDD" at the sources thereof. The drain of the tenth pMOS transistor "PM10" is connected to the source of the fourth pMOS transistor "PM4", to a gate of which the second signal "CPN" is input. The drain of the fifth pMOS transistor "PM5" is connected to the source of the sixth pMOS transistor "PM6", to the gate of which the second signal "CPN" is input.

Whether the signal at the intermediate node "A" is at the "Low" level or at the "High" level, the drains of the tenth pMOS transistor "PM10" and the fifth pMOS transistor "PM5" are at the same signal level.

Therefore, the tenth pMOS transistor "PM10" and the fifth pMOS transistor "PM5" can be shared.

Next, both the eighth nMOS transistor "NM8" and the seventh nMOS transistor "NM7" are connected to a ground "VSS" at the sources thereof and receive the second signal "CPN" at gates thereof. The drain of the eighth nMOS transistor "NM8" is connected to the source of the first nMOS transistor "NM1". The drain of the seventh nMOS transistor "NM7" is connected to the source of the sixth nMOS transistor "NM6".

Whether the second signal "CPN" is at the "Low" level or at the "High" level, the drains of the eighth nMOS transistor "NM8" and the seventh nMOS transistor "NM7" are at the same signal level.

Therefore, the eighth nMOS transistor "NM8" and the seventh nMOS transistor "NM7" can be shared.

Based on the above relationship, in the following, an example of a configuration of a flip-flop circuit in which some MOS transistors are shared will be described.

Figure 2:
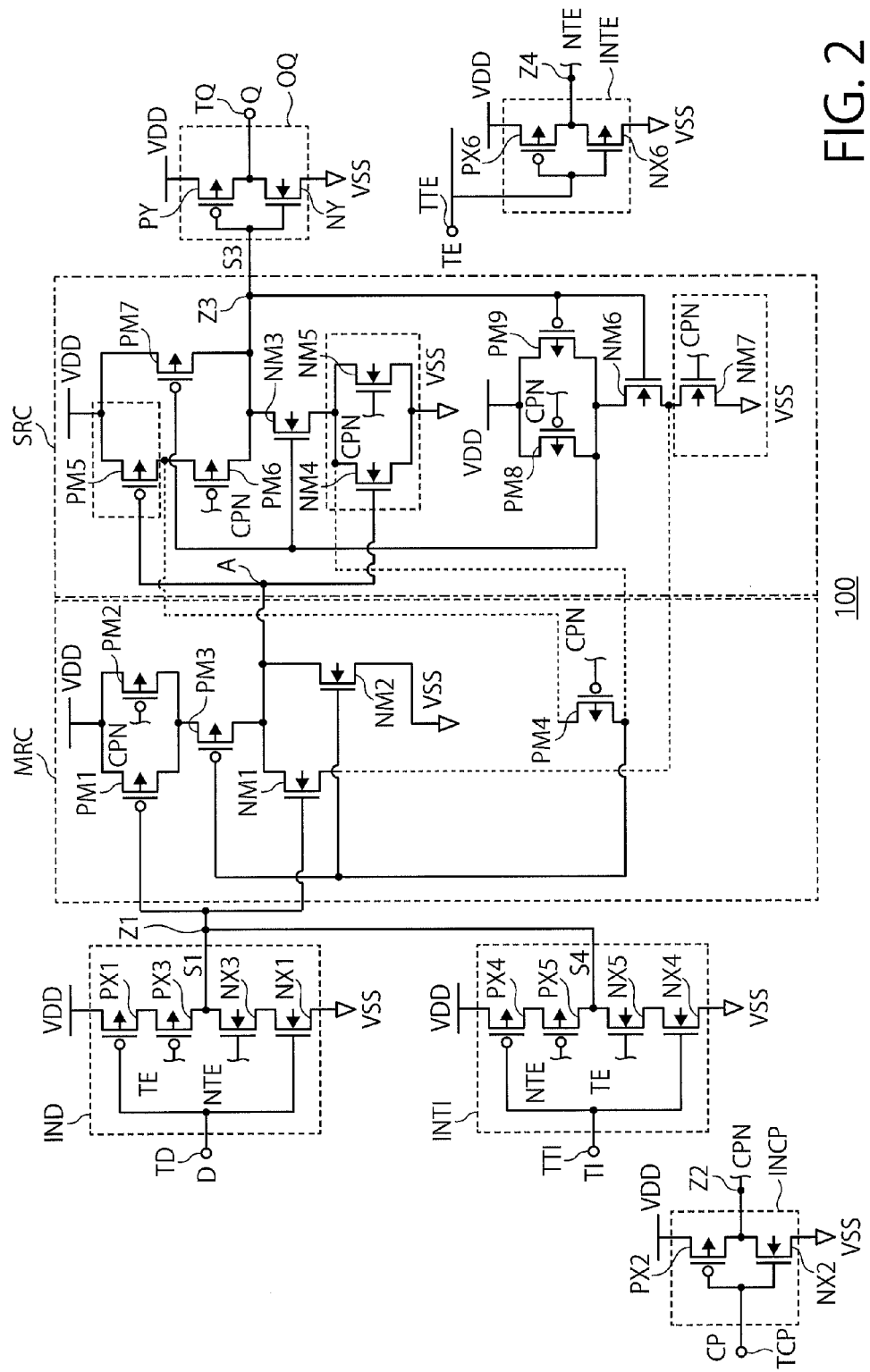
FIG. 2 is a diagram showing an example of a configuration of a flip-flop circuit 100 according to a first embodiment.

FIG. 2 is a diagram showing an example of a configuration of a flip-flop circuit 100 according to a first embodiment. Note that in FIG. 2, the same reference symbols as those in FIG. 1 denote the same components as those in the comparative example shown in FIG. 1.

As shown in FIG. 2, the flip-flop circuit 100 includes a master latch circuit "MRC", a slave latch circuit "SRC", a data terminal "TD", a clock terminal "TCP", an output terminal "TQ", a test terminal "TTI", a switching terminal "TTE", a data input circuit "IND", a clock input circuit "INCP", a test input circuit "INTI", a switching input circuit "INTE", and an output circuit "OQ".

The data terminal "TD" is configured to be supplied with a data signal "D".

The data input circuit "IND" is configured to be supplied with the data signal "D" via the data terminal "TD" and output a first signal "S1" to a first node "Z1". In this example, the first signal "S1" is an inverted signal of the data signal "D".

As shown in FIG. 2, the data input circuit "IND" has a first input pMOS transistor "PX1", a first input nMOS transistor "NX1", a third input pMOS transistor "PX3", and a third input nMOS transistor "NX3", for example.

The first input pMOS transistor "PX1" is connected to a power supply "VDD" at the source thereof, to the first node "Z1" (via the third input pMOS transistor "PX3") at the drain thereof and to the data terminal "TD" at the gate thereof.

The first input nMOS transistor "NX1" is connected to the first node "Z1" (via the third input nMOS transistor "NX3") at the drain thereof, to the ground "VSS" at the source thereof and to the data terminal "TD" at the gate thereof.

The third input pMOS transistor "PX3" is connected between the drain of the first input pMOS transistor "PX1" and the first node "Z1" and connected to the switching terminal "TTE" at the gate thereof.

The third input nMOS transistor "NX3" is connected between the first node "Z1" and the drain of the first input nMOS transistor "NX1" and connected to a fourth node "Z4" at the gate thereof.

The clock terminal "TCP" is configured to be supplied with a clock signal "CP".

The clock input circuit "INCP" is configured to be supplied with the clock signal "CP" via the clock terminal "TCP" and output a second signal "CPN" to a second node "Z2". In this example, the second signal "CPN" is an inverted signal of the clock signal "CP". Note that the second signal "CPN" may be the clock signal "CP".

As shown in FIG. 2, the clock input circuit "INCP" has a second input pMOS transistor "PX2" and a second input nMOS transistor "NX2", for example.

The second input pMOS transistor "PX2" is connected to the power supply "VDD" at the source thereof, to the second node "Z2" at the drain thereof and to the clock terminal "TCP" at the gate thereof.

The second input nMOS transistor "NX2" is connected to the second node "Z2" at the drain thereof, to a ground "VSS" at the source thereof and to the clock terminal "TCP" at the gate thereof.

The test terminal "TTI" is configured to be supplied with a scan test data signal "TI".

The test input circuit "INTI" is configured to be supplied with the scan test data signal "TI" via the test terminal "TTI" and output a fourth signal "S4", which is based on the scan test data signal "TI", to the first node "Z1".

As shown in FIG. 2, the test input circuit "INTI" has a fourth input pMOS transistor "PX4", a fifth input pMOS transistor "PX5", a fourth input nMOS transistor "NX4", and a fifth input nMOS transistor "NX5", for example.

The fourth input pMOS transistor "PX4" is connected to the power supply "VDD" at the source thereof, to the first node "Z1" (via the fifth input pMOS transistor "PX5") at the drain thereof and to the test terminal "TTI" at the gate thereof.

The fourth input nMOS transistor "NX4" is connected to the first node "Z1" (via the fifth input nMOS transistor "NX5") at the drain thereof, to the ground "VSS" at the source thereof and to the test terminal "TTI" at the gate thereof.

The fifth input pMOS transistor "PX5" is connected between the drain of the fourth input pMOS transistor "PX4" and the first node "Z1" and connected to the fourth node "Z4" at the gate thereof.

The fifth input nMOS transistor "NX5" is connected between the first node "Z1" and the drain of the fourth input nMOS transistor "NX4" and connected to the switching terminal "TTE" at the gate thereof.

The switching terminal "TTE" is configured to be supplied with a switching signal "TE" for switching between the data signal "D" and the scan test data signal "TI".

The switching input circuit "INTE" is configured to be supplied with the switching signal "TE" via the switching terminal "TTE" and output a fifth signal "NTE", which is based on the switching signal "TE", to the fourth node "Z4".

As shown in FIG. 1, the switching input circuit "INTE" has a sixth input pMOS transistor "PX6" and a sixth input nMOS transistor "NX6", for example.

The sixth input pMOS transistor "PX6" is connected to the power supply "VDD" at the source thereof, to the fourth node "Z4" at the drain thereof and to the switching terminal "TTE" at the gate thereof.

The sixth input nMOS transistor "NX6" is connected to the fourth node "Z4" at the drain thereof, to the ground "VSS" at the source thereof and to the switching terminal "TTE" at the gate thereof.

With the flip-flop circuit 100 configured as described above, depending on the switching signal "TE" and the fifth signal "NTE", only one of the first signal "S1" output from the data input circuit "IND" and the fourth signal "S4" output from the test input circuit "INTI" is supplied to the first node "Z1".

The output terminal "TQ" is configured to output an output signal "Q".

The output circuit "OQ" is configured to be supplied with a third signal "S3" via the third node "Z3" and output the output signal "Q" to the output terminal "TQ". In this example, the output signal "Q" is an inverted signal of the third signal "S3". Note that the third signal "S3" may be the output signal "Q".

As shown in FIG. 2, the output circuit "OQ" has an output pMOS transistor "PY" and an output nMOS transistor "NY", for example.

The output pMOS transistor "PY" is connected to the power supply "VDD" at the source thereof, to the third node "Z3" at the gate thereof and to the output terminal "TQ" at the drain thereof.

The output nMOS transistor "NY" is connected to the third node "Z3" at the gate thereof, to the ground "VSS" at the source thereof and to the output terminal "TQ" at the drain thereof.

That is, the flip-flop circuit 100 is configured to output the output signal "Q" based on the third signal "S3" at the third node "Z3".

The master latch circuit "MRC" has a first pMOS transistor "PM1", a second pMOS transistor "PM2", a third pMOS transistor "PM3", a fourth pMOS transistor "PM4", a first nMOS transistor "NM1" and a second nMOS transistor "NM2".

The slave latch circuit "SRC" has a fifth pMOS transistor "PM5", a sixth pMOS transistor "PM6", a seventh pMOS transistor "PM7", an eighth pMOS transistor "PM8", a ninth pMOS transistor "PM9", a third nMOS transistor "NM3", a fourth nMOS transistor "NM4", a fifth nMOS transistor "NM5", a sixth nMOS transistor "NM6" and a seventh nMOS transistor "NM7".

Note that, as described earlier, the master latch circuit "MRC" and the slave latch circuit "SRC" share the fifth pMOS transistor "PM5", the fourth nMOS transistor "NM4", the fifth nMOS transistor "NM5" and the seventh nMOS transistor "NM7".

As shown in FIG. 2, the first pMOS transistor "PM1" is connected to the power supply "VDD" at the source thereof and to the first node "Z1", to which the first signal "S1" based on the data signal "D" or the signal "S4" based on the scan test data signal "TI" is supplied, at the gate thereof.

The second pMOS transistor "PM2" is connected to the power supply "VDD" at the source thereof and to the second node "Z2", to which the second signal "CPN" based on the clock signal "CP" is supplied, at the gate thereof.

The third pMOS transistor "PM3" is connected to the drains of the first pMOS transistor "PM1" and the second pMOS transistor "PM2" at the source thereof and to the intermediate node "A", at which the master latch circuit "MRC" and the slave latch circuit "SRC" are connected to each other, at the drain thereof.

The first nMOS transistor "NM1" is connected to the intermediate node "A" and the drain of the third pMOS transistor "PM3" at the drain thereof and to the first node "Z1" at the gate thereof.

The second nMOS transistor "NM2" is connected to the intermediate node "A", the drain of the third pMOS transistor "PM3" and the drain of the first nMOS transistor "NM1" at the drain thereof, to the ground "VSS" at the source thereof and to the gate of the third pMOS transistor "PM3" at the gate thereof.

The fourth pMOS transistor "PM4" is connected to the gates of the third pMOS transistor "PM3" and the second nMOS transistor "NM2" at the drain thereof and to the second node "Z2" at the gate thereof.

The fifth pMOS transistor "PM5" is connected to the power supply "VDD" at the source thereof and to the intermediate node "A" at the gate thereof.

The sixth pMOS transistor "PM6" is connected to the drain of the fifth pMOS transistor "PM5" at the source thereof, to the third node "Z3" at the drain thereof and to the second node "Z2" at the gate thereof.

The seventh pMOS transistor "PM7" is connected to the power supply "VDD" at the source thereof and to the third node "Z3" and the drain of the sixth pMOS transistor "PM6" at the drain thereof.

The third nMOS transistor "NM3" is connected to the third node "Z3" and the drains of the sixth pMOS transistor "PM6" and the seventh pMOS transistor "PM7" at the drain thereof and to the gate of the seventh pMOS transistor "PM7" at the gate thereof.

The fourth nMOS transistor "NM4" is connected to the source of the third nMOS transistor "NM3" at the drain thereof, to the ground "VSS" at the source thereof and to the intermediate node "A" at the gate thereof.

The fifth nMOS transistor "NM5" is connected to the source of the third nMOS transistor "NM3" and the drain of the fourth nMOS transistor "NM4" at the drain thereof, to the ground "VSS" at the source thereof and to the second node "Z2" at the gate thereof.

The eighth pMOS transistor "PM8" is connected to the power supply "VDD" at the source thereof, to the gates of the seventh pMOS transistor "PM7" and the third nMOS transistor "NM3" at the drain thereof and to the second node "Z2" at the gate thereof.

The ninth pMOS transistor "PM9" is connected to the power supply "VDD" at the source thereof, to the gates of the seventh pMOS transistor "PM7" and the third nMOS transistor "NM3" and the drain of the eighth pMOS transistor "PM8" at the drain thereof and to the third node "Z3" at the gate thereof.

The sixth nMOS transistor "NM6" is connected to the gates of the seventh pMOS transistor "PM7" and the third nMOS transistor "NM3" and the drains of the eighth pMOS transistor "PM8" and the ninth pMOS transistor "PM9" at the drain thereof and to the third node "Z3" at the gate thereof.

The seventh nMOS transistor "NM7" is connected to the source of the sixth nMOS transistor "NM6" at the drain thereof, to the ground "VSS" at the source thereof and to the second node "Z2" at the gate thereof.

The relations of connections in the flip-flop circuit 100 according to the first embodiment differ from those in the flip-flop circuit 100X according to the comparative example in the following respects.

The source of the first nMOS transistor "NM1" is connected to the source of the sixth nMOS transistor "NM6" and the drain of the seventh nMOS transistor "NM7" (as shown by a dotted line in FIG. 2).

The source of the fourth pMOS transistor "PM4" is connected to the drain of the fifth pMOS transistor "PM5" and the source of the sixth pMOS transistor "PM6" (as shown by a dotted line in FIG. 2).

The drain of the fourth pMOS transistor "PM4" is connected to the source of the third nMOS transistor "NM3" and the drains of the fourth nMOS transistor "NM4" and the fifth nMOS transistor "NM5" (as shown by a dotted line in FIG. 2).

As described above, the flip-flop circuit 100 according to the first embodiment differs from the flip-flop circuit 100X according to the comparative example in that the master latch circuit "MRC" and the slave latch circuit "SRC" share some MOS transistors.

Comparing the flip-flop circuit 100 according to the first embodiment shown in FIG. 2 with the flip-flop circuit 100X according to the comparative example shown in FIG. 1, the number of MOS transistors can be reduced from 34 to 30. Thus, according to the first embodiment, the cell size of the flip-flop circuit can be reduced.

According to the first embodiment, four MOS transistors are shared with other MOS transistors. However, the cell size can be reduced if at least one MOS transistor is shared with another MOS transistor.

That is, it is a minimum requirement that the transistors of at least one combination among a combination of the eighth nMOS transistor "NM8" and the seventh nMOS transistor "NM7", a combination of the ninth nMOS transistor "NM9" and the fifth nMOS transistor "NM5", a combination of the tenth nMOS transistor "NM10" and the fourth nMOS transistor "NM4", and a combination of the tenth pMOS transistor "PM10" and the fifth pMOS transistor "PM5" are configured to be one common transistor.

In particular, according to the first embodiment, MOS transistors which have gate inputs at the intermediate node "A", at which the master latch circuit and the slave latch circuit are connected to each other, and constitute loads, are two MOS transistors such as the fifth pMOS transistor "PM5" and the fourth nMOS transistor "NM4". According to the first embodiment, the number of the MOS transistors constituting loads is reduced compared with the comparative example, in which four MOS transistors, the fifth pMOS transistor "PM5", the fourth nMOS transistor "NM4", the tenth pMOS transistor "PM10" and the tenth nMOS transistor "NM10", constitute loads.

Thus, in response to the clock signal "CP", the signal held in the master latch circuit "MRC" can be output at higher speed as the output signal "Q" via the intermediate node "A", the slave latch circuit "SRC" and the output circuit.

As described above, the flip-flop circuit according to the first embodiment can be reduced in cell size and improved in processing speed.

Second Embodiment

Figure 3:
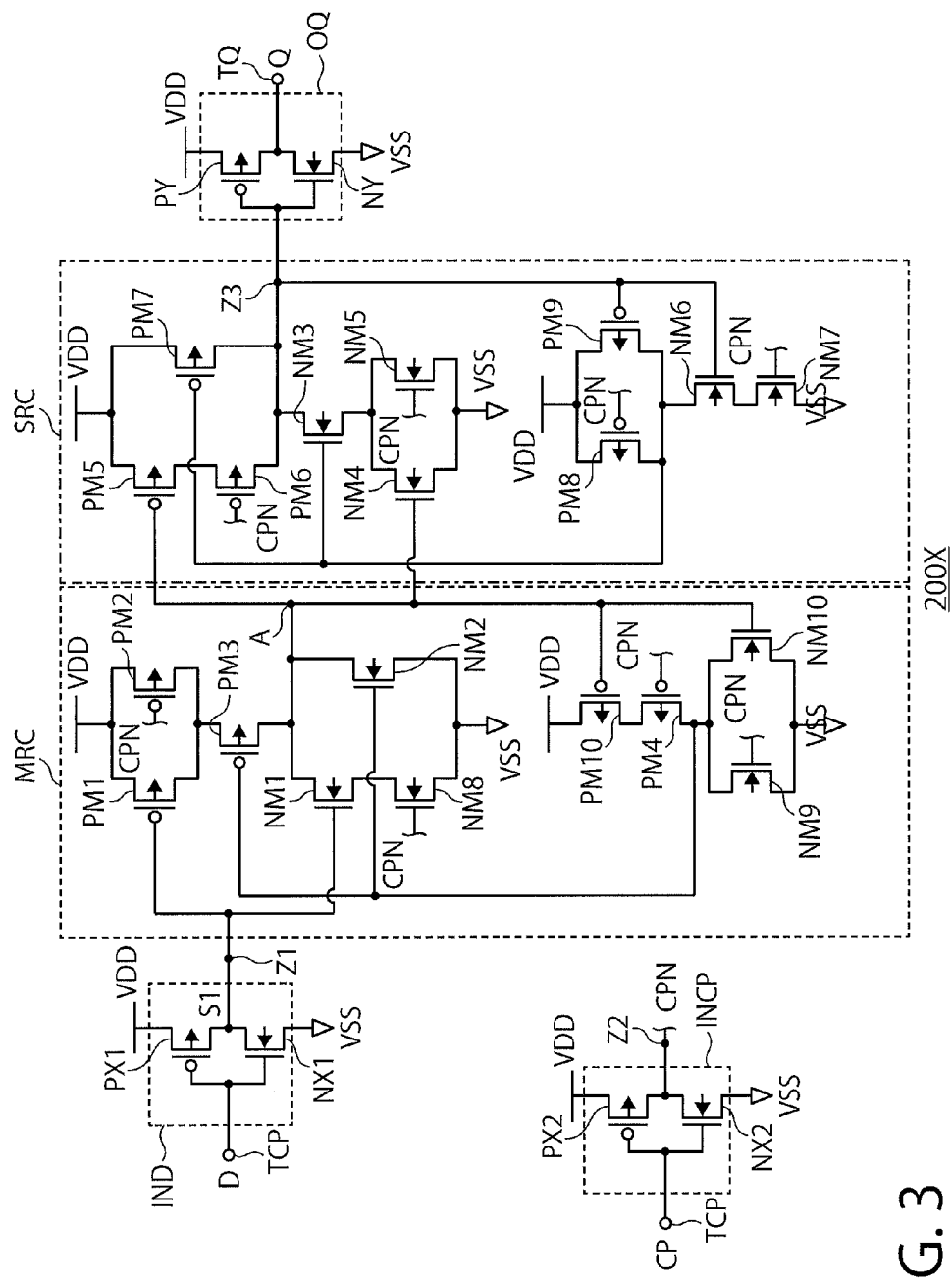
FIG. 3 is a diagram showing an example of a configuration of a flip-flop circuit 200X according to a comparative example.

FIG. 3 is a diagram showing an example of a configuration of a flip-flop circuit 200X according to a comparative example.

As shown in FIG. 3, the flip-flop circuit 200X includes a master latch circuit "MRC", a slave latch circuit "SRC", a data terminal "TD", a clock terminal "TCP", an output terminal "TQ", a data input circuit "IND", a clock input circuit "INCP" and an output circuit "OQ".

That is, the flip-flop circuit 200X according to the comparative example shown in FIG. 3 differs from the flip-flop circuit 100X shown in FIG. 1 in that the test terminal "M", the switching terminal "TTE", the test input circuit "INTI" and the switching input circuit "INTE" are omitted.

The remainder of the flip-flop circuit 200X is the same as that of the flip-flop circuit 100X shown in FIG. 1.

In the following, an example of an operation of the flip-flop circuit 200X configured as described above will be described.

If the data signal "D" is at the "Low" level, and the clock signal "CP" is at the "Low" level, the second input pMOS transistor "PX2" is turned on, and the second input nMOS transistor "NX2" is turned off. As a result, the second signal "CPN" is set at the "High" level.

At this time, the first input pMOS transistor "PX1" is turned on, and the first input nMOS transistor "NX1" is turned off. As a result, the inputs of the first pMOS transistor "PM1" and the first nMOS transistor "NM1" in the master latch circuit "MRC" are set at the "High" level.

Then, in the master latch circuit "MRC", the first pMOS transistor "PM1" is turned off, the first nMOS transistor "NM1" is turned on, the second pMOS transistor "PM2" is turned off, the eighth nMOS transistor "NM8" is turned on, the fourth pMOS transistor "PM4" is turned off, and the ninth nMOS transistor "NM9" is turned on.

Then, since the ninth nMOS transistor "NM9" is in the on state, the output of the drain of the ninth nMOS transistor "NM9" is at the "Low" level, the third pMOS transistor "PM3" is turned on, the second nMOS transistor "NM2" is turned off, and the first nMOS transistor "NM1" and the eighth nMOS transistor "NM8" are turned on. As a result, the output at the intermediate node "A" is at the "Low" level, and therefore, the tenth pMOS transistor "PM10" is turned on, and the tenth nMOS transistor "NM10" is turned off.

Then, in the slave latch circuit "SRC", since the intermediate node "A" is at the "Low" level, the fifth pMOS transistor "PM5" is turned on, and the fourth nMOS transistor "NM4" is turned off. And since the second signal "CPN" is at the "High" level, the sixth pMOS transistor "PM6" is turned off, the fifth nMOS transistor "NM5" is turned on, the eighth pMOS transistor "PM8" is turned off, the seventh nMOS transistor "NM7" is turned on.

At this point in time, in the slave latch circuit "SRC", both the output of the OAI circuit formed by the fifth pMOS transistor "PM5", the sixth pMOS transistor "PM6", the seventh pMOS transistor "PM7", the third nMOS transistor "NM3", the fourth nMOS transistor "NM4" and the fifth nMOS transistor "NM5" and the output of the NAND circuit formed by the eighth pMOS transistor "PM8", the ninth pMOS transistor "PM9", the sixth nMOS transistor "NM6" and the seventh nMOS transistor "NM7" are variable. Therefore, the state (on or off) of the seventh pMOS transistor "PM7", the third nMOS transistor "NM3", the ninth pMOS transistor "PM9" and the sixth nMOS transistor "NM6" are indeterminate.

Therefore, the output of the slave latch circuit "SRC" (that is, the signal at the third node "Z3") is indeterminate. As a result, the output signal "Q" of the output circuit "OQ" (the output pMOS transistor "PY" and the output nMOS transistor "NY") is also indeterminate.

Next, with the clock signal "CP" kept at the "Low" level, that is, the second signal "CPN" kept at the "High" level, the data signal "D" is changed from the "Low" level to the "High" level. As a result, the first input pMOS transistor "PX1" is turned off, and the first input nMOS transistor "NX1" is turned on. As a result, the gates of the first pMOS transistor "PM1" and the first nMOS transistor "NM1" in the master latch circuit "MRC" are set at the "Low" level.

As a result, in the master latch circuit "MRC", the first pMOS transistor "PM1" is turned on, and the first nMOS transistor "NM1" is turned off. Furthermore, since the second signal "CPN" is at the "High" level, the second pMOS transistor "PM2" is turned off, the eighth nMOS transistor "NM8" is turned on, the fourth pMOS transistor "PM4" is turned off, and the ninth nMOS transistor "NM9" is turned on.

Then, since the ninth nMOS transistor "NM9" is turned on, the drain of the ninth nMOS transistor "NM9" is set at the "Low" level, the third pMOS transistor "PM3" is turned on, and the second nMOS transistor "NM2" is turned off.

Then, since the first pMOS transistor "PM1" and the third pMOS transistor "PM3" are in the on state, the output at the intermediate node "A" is at the "High" level. As a result, the tenth pMOS transistor "PM10" is turned off, and the tenth nMOS transistor "NM10" is turned on.

Then, in the slave latch circuit "SRC", since the intermediate node "A" is at the "High" level, the fifth pMOS transistor "PM5" is turned off, and the fourth nMOS transistor "NM4" is turned on. And since the second signal "CPN" is at the "High" level, the sixth pMOS transistor "PM6" is turned off, the fifth nMOS transistor "NM5" is turned on, the eighth pMOS transistor "PM8" is turned off, and the seventh nMOS transistor "NM7" is turned on.

The state (on or off) of the seventh pMOS transistor "PM7", the third nMOS transistor "NM3", the ninth pMOS transistor "PM9" and the sixth nMOS transistor "NM6" is indeterminate.

Since the output of the slave latch circuit "SRC" is indeterminate, the output signal "Q" of the output circuit "OQ" (the output pMOS transistor "PY" and the output nMOS transistor "NY") is also indeterminate.

Next, with the data signal "D" kept at the "High" level, the clock signal "CP" is changed from the "Low" level to the "High" level. As a result, the second signal "CPN" is set at the "Low" level, the first input pMOS transistor "PX1" is turned off, and the first input nMOS transistor "NX1" is turned on. As a result, the gates of the first pMOS transistor "PM1" and the first nMOS transistor "NM1" are set at the "Low" level.

Then, in the master latch circuit "MRC", the first pMOS transistor "PM1" is turned on, and the first nMOS transistor "NM1" is turned off. Furthermore, since the second signal "CPN" is at the "Low" level, the second pMOS transistor "PM2" is turned on, the eighth nMOS transistor "NM8" is turned off, the fourth pMOS transistor "PM4" is turned on, and the ninth nMOS transistor "NM9" is turned off.

When the clock signal "CP" was in the previous state, that is, at the "Low" level, the output at the intermediate node "A" was at the "High" level. Therefore, even though the clock signal "CP" has been changed from the "Low" level to the "High" level, the tenth pMOS transistor "PM10" is in the off state, and the tenth nMOS transistor "NM10" is in the on state. As a result, the drain of the tenth nMOS transistor "NM10" is at the "Low" level, the third pMOS transistor "PM3" is in the on state, and the second nMOS transistor "NM2" is in the off state.

As a result, the output (at the intermediate node "A") of the master latch circuit "MRC" is kept at the "High" level.

In the slave latch circuit "SRC", since the intermediate node "A" is at the "High" level, the fifth pMOS transistor "PM5" is turned off, and the fourth nMOS transistor "NM4" is turned on. And since the second signal "CPN" is at the "Low" level, the sixth pMOS transistor "PM6" is turned on, the fifth nMOS transistor "NM5" is turned off, the eighth pMOS transistor "PM8" is turned on, and the seventh nMOS transistor "NM7" is turned off.

Since the eighth pMOS transistor "PM8" is turned on, the drain of the eighth pMOS transistor "PM8" is set at the "High" level, the seventh pMOS transistor "PM7" is turned off, and the third nMOS transistor "NM3" is turned on. Then, since the third nMOS transistor "NM3" and the fourth nMOS transistor "NM4" are turned on, the drain of the third nMOS transistor "NM3" is set at the "Low" level, the ninth pMOS transistor "PM9" is turned on, and the sixth nMOS transistor "NM6" is turned off.

Since the output of the slave latch circuit "SRC" (that is, the signal at the third node "Z3") is at the "Low" level, the output signal "Q" of the output circuit "OQ" (the output pMOS transistor "PY" and the output nMOS transistor "NY") is at the "High" level.

Next, with the data signal "D" kept at the "High" level, the clock signal "CP" is changed from the "High" level to the "Low" level. As a result, the second signal "CPN" having been set at the "Low" level is set at the "High" level. As a result, the first input pMOS transistor "PX1" is turned off, and the first input nMOS transistor "NX1" is kept on.

As a result, in the master latch circuit "MRC", the gates of the first pMOS transistor "PM1" and the first nMOS transistor "NM1." are at the "Low" level.

In the master latch circuit "MRC", the first pMOS transistor "PM1" is turned on, and the first nMOS transistor "NM1" is turned off. Furthermore, since the second signal "CPN" is at the "High" level, the second pMOS transistor "PM2" is turned off, the eighth nMOS transistor "NM8" is turned on, the fourth pMOS transistor "PM4" is turned off, and the ninth nMOS transistor "NM9" is turned on.

Since the ninth nMOS transistor "NM9" is turned on, the drain of the ninth nMOS transistor "NM9" is set at the "Low" level, the third pMOS transistor "PM3" is turned on, and the second nMOS transistor "NM2" is turned off. Then, since the first pMOS transistor "PM1" and the third pMOS transistor "PM3" are in the on state, the output at the intermediate node "A" is at the "High" level. Therefore, the tenth pMOS transistor "PM10" is turned off, and the tenth nMOS transistor "NM10" is turned on.

In the slave latch circuit "SRC", since the intermediate node "A" is at the "High" level, the fifth pMOS transistor "PM5" is turned off, and the fourth nMOS transistor "NM4" is turned on. And since the second signal "CPN" is at the "High" level, the sixth pMOS transistor "PM6" is turned off, the fifth nMOS transistor "NM5" is turned on, the eighth pMOS transistor "PM8" is turned off, and the seventh nMOS transistor "NM7" is turned on.

Since the previous state of the third node "Z3" is the "Low" level, the ninth pMOS transistor "PM9" is turned on, and the sixth nMOS transistor "NM6" is turned off. Therefore, the drain of the ninth pMOS transistor "PM9" is at the "High" level, and therefore, the seventh pMOS transistor "PM7" is turned off, and the third nMOS transistor "NM3" is turned on. Then, the third node "Z3" is kept at the "Low" level.

Since the output of the slave latch circuit "SRC" (that is, the signal at the third node "Z3") is at the "Low" level, the output signal "Q" of the output circuit "OQ" (the output pMOS transistor "PY" and the output nMOS transistor "NY") is at the "High" level.

Next, with the clock signal "CP" kept at the "Low" level, the data signal "D" is changed from the "High" level to the "Low" level. As a result, the second signal "CPN" is kept at the "High" level, the first input pMOS transistor "PX1" is turned on, and the first input nMOS transistor "NX1" is turned off.

In the master latch circuit "MRC", since the gates of the first pMOS transistor "PM1" and the first nMOS transistor "NM1" are at the "High" level, the first pMOS transistor "PM1" is turned off, and the first nMOS transistor "NM1" is turned on. Furthermore, since the second signal "CPN" is at the "High" level, the second pMOS transistor "PM2" is turned off, the eighth nMOS transistor "NM8" is turned on, the fourth pMOS transistor "PM4" is turned off, and the ninth nMOS transistor "NM9" is turned on.

Then, since the ninth nMOS transistor "NM9" is turned on, the drain of the ninth nMOS transistor "NM9" is set at the "Low" level, the third pMOS transistor "PM3" is turned on, and the second nMOS transistor "NM2" is turned off. Furthermore, since the first nMOS transistor "NM1" and the eighth nMOS transistor "NM8" are in the on state, the output at the intermediate node "A" is at the "Low" level. As a result, the tenth pMOS transistor "PM10" is turned on, and the tenth nMOS transistor "NM10" is turned off.

Then, in the slave latch circuit "SRC", since the intermediate node "A" is at the "Low" level, the fifth pMOS transistor "PM5" is turned on, and the fourth nMOS transistor "NM4" is turned off. And since the second signal "CPN" is at the "High" level, the sixth pMOS transistor "PM6" is turned off, the fifth nMOS transistor "NM5" is turned on, the eighth pMOS transistor "PM8" is turned off, and the seventh nMOS transistor "NM7" is turned on. Furthermore, since the previous state of the third node "Z3" was the "Low" level, the ninth pMOS transistor "PM9" is turned on, and the sixth nMOS transistor "NM6" is turned off. Therefore, the drain of the ninth pMOS transistor "PM9" is at the "High" level, the seventh pMOS transistor "PM7" is turned off, and the third nMOS transistor "NM3" is turned on. As a result, since the third nMOS transistor "NM3" and the fifth nMOS transistor "NM5" are in the on state, the drain of the third nMOS transistor "NM3" is at the "Low" level, and the third node "Z3" is kept at the "Low" level.

Since the output of the slave latch circuit "SRC" (that is, the signal at the third node "Z3") is at the "Low" level, the output signal "Q" of the output circuit "OQ" (the output pMOS transistor "PY" and the output nMOS transistor "NY") is kept at the "High" level.

Next, with the data signal "D" kept at the "Low" level, the clock signal "CP" is changed from the "Low" level to the "High" level. As a result, the second signal "CPN" changes to the "Low" level. Thus, the first input pMOS transistor "PX1" is turned on, and the first input nMOS transistor "NX1" is turned off.

Therefore, the gates of the first pMOS transistor "PM1" and the first nMOS transistor "NM1." are kept at the "High" level.

In the master latch circuit "MRC", the first pMOS transistor "PM1" is turned off, and the first nMOS transistor "NM1" is turned on. Furthermore, since the second signal "CPN" is at the "Low" level, the second pMOS transistor "PM2" is turned on, the eighth nMOS transistor "NM8" is turned off, the fourth pMOS transistor "PM4" is turned on, and the ninth nMOS transistor "NM9" is turned off.

Since the previous state of the intermediate node "A" was the "Low" level, the tenth pMOS transistor "PM10" is in the on state, and the tenth nMOS transistor "NM10" is in the off state. Therefore, since the drain of the fourth pMOS transistor "PM4" is at the "High" level, the third pMOS transistor "PM3" is turned off, and the second nMOS transistor "NM2" is turned on. Therefore, the intermediate node "A" is kept at the "Low" level.

Then, in the slave latch circuit "SRC", since the intermediate node "A" is at the "Low" level, the fifth pMOS transistor "PM5" is turned on, and the fourth nMOS transistor "NM4" is turned off. And since the second signal "CPN" is at the "Low" level, the sixth pMOS transistor "PM6" is turned on, the fifth nMOS transistor "NM5" is turned off, the eighth pMOS transistor "PM8" is turned on, and the seventh nMOS transistor "NM7" is turned off.

Since the fifth pMOS transistor "PM5" and the sixth pMOS transistor "PM6" are turned on, the drain of the sixth pMOS transistor "PM6" is set at the "High" level, the third node "Z3" is set at the "High" level, the ninth pMOS transistor "PM9" is turned off, and the sixth nMOS transistor "NM6" is turned on. Since the eighth pMOS transistor "PM8" is turned on, the drain of the eighth pMOS transistor "PM8" is set at the "High" level, the seventh pMOS transistor "PM7" is turned off, and the third nMOS transistor "NM3" is turned on.

Since the output of the slave latch circuit "SRC" (that is, the signal at the third node "Z3") is at the "High" level, the output signal "Q" of the output circuit "OQ" (the output pMOS transistor "PY" and the output nMOS transistor "NY") is set at the "Low" level.

Next, with the data signal "D" kept at the "Low" level, the clock signal "CP" is changed from the "High" level to the "Low" level. As a result, the second signal "CPN" changes to the "High" level, the first input pMOS transistor "PX1" is turned on, and the first input nMOS transistor "NX1" is turned off. Therefore, the gates of the first pMOS transistor "PM1" and the first nMOS transistor "NM1" are kept at the "High" level.

In the master latch circuit "MRC", the first pMOS transistor "PM1" is turned off, and the first nMOS transistor "NM1" is turned on. Furthermore, since the second signal "CPN" is at the "High" level, the second pMOS transistor "PM2" is turned off, the eighth nMOS transistor "NM8" is turned on, the fourth pMOS transistor "PM4" is turned off, and the ninth nMOS transistor "NM9" is turned on.

Since the first nMOS transistor "NM1" and the eighth nMOS transistor "NM8" are turned on, the output at the intermediate node "A" is at the "Low" level. As a result, the tenth pMOS transistor "PM10" is turned on, the tenth nMOS transistor "NM10" is turned off, and the ninth nMOS transistor "NM9" is turned on. Therefore, the third pMOS transistor "PM3" is turned on, and the second nMOS transistor "NM2" is turned off.

Then, in the slave latch circuit "SRC", since the intermediate node "A" is at the "Low" level, the fifth pMOS transistor "PM5" is turned on, and the fourth nMOS transistor "NM4" is turned off. And since the second signal "CPN" is at the "High" level, the sixth pMOS transistor "PM6" is turned off, the fifth nMOS transistor "NM5" is turned on, the eighth pMOS transistor "PM8" is turned off, and the seventh nMOS transistor "NM7" is turned on.

Since the third node "Z3" has been at the "High" level, the ninth pMOS transistor "PM9" is in the off state, and the sixth nMOS transistor "NM6" is in the on state. As a result, the seventh pMOS transistor "PM7" is turned on, the third nMOS transistor "NM3" is turned off, and the third node "Z3" is kept at the "High" level.

Since the output of the slave latch circuit "SRC" (that is, the signal at the third node "Z3") is at the "High" level, the output signal "Q" of the output circuit "OQ" (the output pMOS transistor "PY" and the output nMOS transistor "NY") is kept at the "Low" level.

The flip-flop circuit 200X operates in response to the data signal "D" and the clock signal "CP" as described above. That is, when the data signal is at the "Low" level, and the clock signal is at the "Low" level, the output signal is at the "Low" level. When the data signal is at the "High" level, and the clock signal is at the "Low" level, the output signal is at the "High" level. When the clock signal is at the "High" level, the output signal is kept in the previous state whether the data signal is at the "Low" level or the "High" level.

Figure 4:
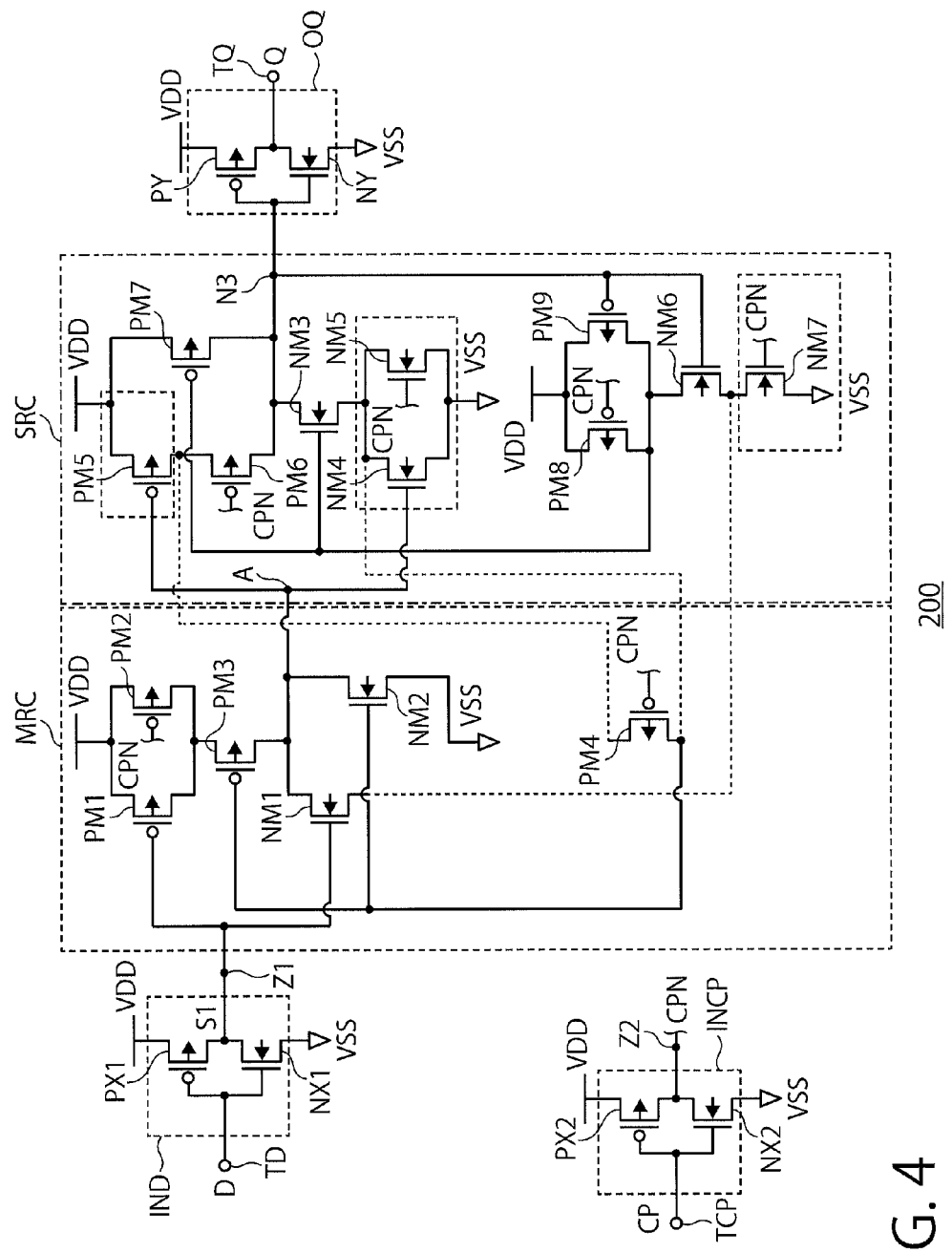
FIG. 4 is a diagram showing an example of a configuration of a flip-flop circuit 200 according to a second embodiment.

FIG. 4 is a diagram showing an example of a configuration of a flip-flop circuit 200 according to a second embodiment. In FIG. 4, the same reference symbols as those in FIG. 2 denote the same components as those according to the first embodiment.

As shown in FIG. 4, the flip-flop circuit 200 includes a master latch circuit "MRC", a slave latch circuit "SRC", a data terminal "TD", a clock terminal "TCP", an output terminal "TQ", a data input circuit "IND", a clock input circuit "INCP" and an output circuit "OQ".

That is, the flip-flop circuit 200 according to the second embodiment shown in FIG. 4 differs from the flip-flop circuit 100 shown in FIG. 2 in that the test terminal "TTI", the switching terminal "TTE", the test input circuit "INTI" and the switching input circuit "INTE" are omitted.

The remainder of the flip-flop circuit 200 is the same as that of the flip-flop circuit 100 according to the first embodiment shown in FIG. 2.

As in the first embodiment, the relations of connections in the flip-flop circuit 200 according to the second embodiment differ from those in the flip-flop circuit 200X according to the comparative example in the following respects.

The source of the first nMOS transistor "NM1" is connected to the source of the sixth nMOS transistor "NM6" and the drain of the seventh nMOS transistor "NM7" (as shown by a dotted line in FIG. 4).

The source of the fourth pMOS transistor "PM4" is connected to the drain of the fifth pMOS transistor "PM5" and the source of the sixth pMOS transistor "PM6" (as shown by a dotted line in FIG. 4).

The drain of the fourth pMOS transistor "PM4" is connected to the source of the third nMOS transistor "NM3" and the drains of the fourth nMOS transistor "NM4" and the fifth nMOS transistor "NM5" (as shown by a dotted line in FIG. 4).

As described above, the flip-flop circuit 200 according to the second embodiment differs from the flip-flop circuit 200X according to the comparative example in that the master latch circuit "MRC" and the slave latch circuit "SRC" share some MOS transistors.

That is, comparing the flip-flop circuit 200 according to the second embodiment shown in FIG. 4 with the flip-flop circuit 200X according to the comparative example shown in FIG. 3, the number of MOS transistors can be reduced from 26 to 22. Thus, according to the second embodiment, the cell size of the flip-flop circuit can be reduced.

In particular, according to the second embodiment, MOS transistors which have gate inputs at the intermediate node "A", at which the master latch circuit and the slave latch circuit are connected to each other, and constitute loads, are two MOS transistors such as the fifth pMOS transistor "PM5" and the fourth nMOS transistor "NM4". As in the first embodiment, according to the second embodiment, the number of the MOS transistors constituting loads is reduced compared with the comparative example, in which four MOS transistors constitute loads.

Thus, in response to the clock signal "CP", the signal held in the master latch circuit "MRC" can be output at higher speed as the output signal "Q" via the intermediate node "A", the slave latch circuit "SRC" and the output circuit.

The operation of the flip-flop circuit 200 according to the second embodiment is the same as the operation of the flip-flop circuit 200X according to the comparative example described above.

As described above, the flip-flop circuit according to the second embodiment can be reduced in cell size and improved in processing speed, as with the flip-flop circuit according to the first embodiment.

Third Embodiment

Figure 5:
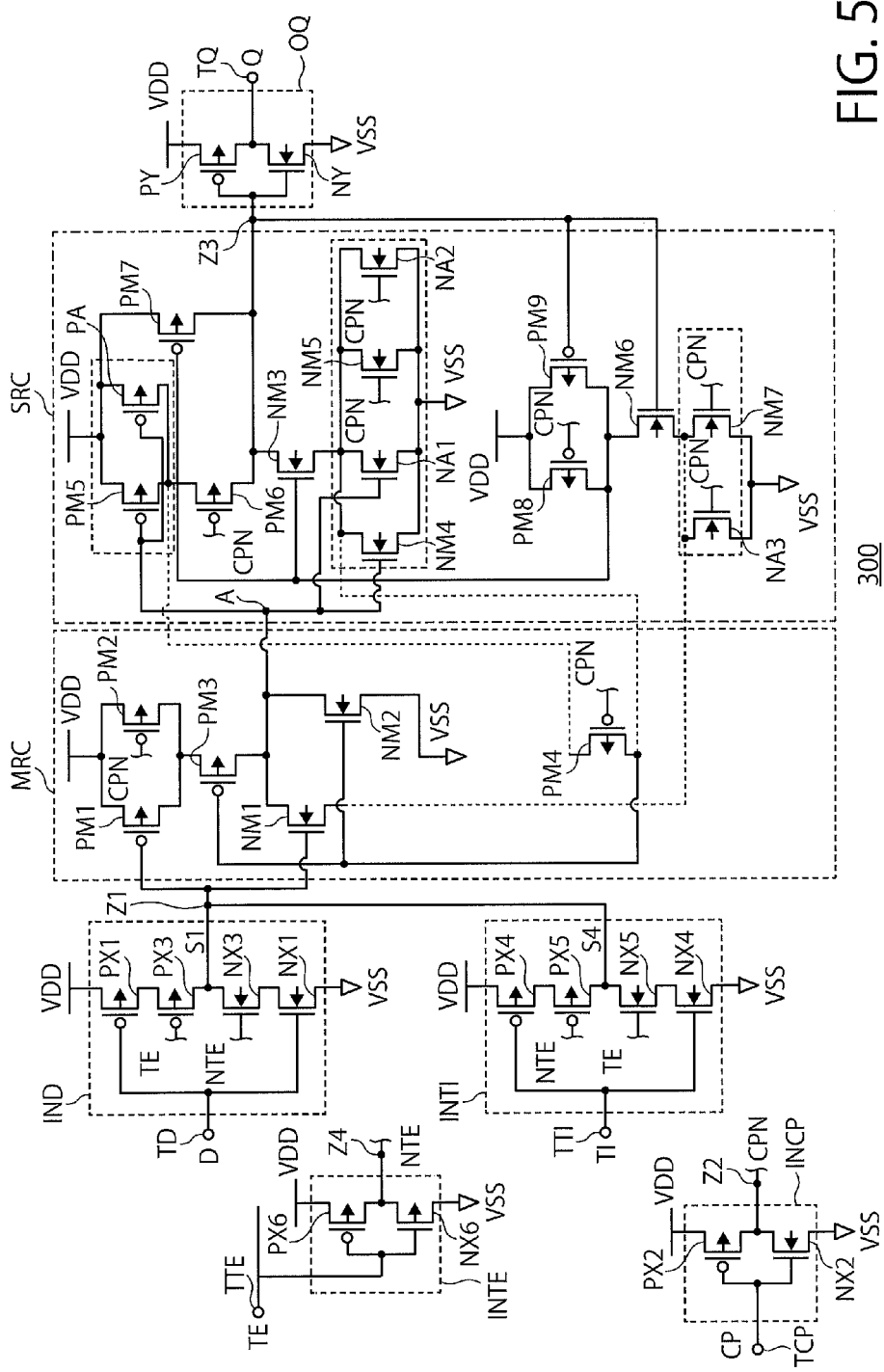
FIG. 5 is a diagram showing an example of a configuration of a flip-flop circuit 300 according to a third embodiment.

FIG. 5 is a diagram showing an example of a configuration of a flip-flop circuit 300 according to a third embodiment. In FIG. 5, the same reference symbols as those in FIG. 2 denote the same components as those according to the first embodiment.

As shown in FIG. 5, the flip-flop circuit 300 includes a master latch circuit "MRC", a slave latch circuit "SRC", a data terminal "TD", a clock terminal "TCP", an output terminal "TQ", a test terminal "TTI", a switching terminal "TTE", a test input circuit "INTI", a switching input circuit "INTE", a data input circuit "IND", a clock input circuit "INCP" and an output circuit "OQ".

In particular, as shown in FIG. 5, the flip-flop circuit 300 (the slave latch circuit "SRC") according to the third embodiment differs from the flip-flop circuit 100 according to the first embodiment in that it further includes an additional pMOS transistor "PA", a first additional nMOS transistor "NA1", a second additional nMOS transistor "NA2" and a third additional nMOS transistor "NA3".

The additional pMOS transistor "PA" is connected in parallel with the fifth pMOS transistor "PM5". That is, the additional pMOS transistor "PA" is connected to the source of the fifth pMOS transistor "PM5" at the source thereof, to the drain of the fifth pMOS transistor "PM5" at the drain thereof and to the gate of the fifth pMOS transistor "PM5" at the gate thereof.

The size of the additional pMOS transistor "PA" is the same as that of the fifth pMOS transistor "PM5", for example.

The first additional nMOS transistor "NA1" is connected in parallel with the fourth nMOS transistor "NM4". That is, the first additional nMOS transistor "NA1" is connected to the source of the fourth nMOS transistor "NM4" at the source thereof, to the drain of the fourth nMOS transistor "NM4" at the drain thereof and to the gate of the fourth nMOS transistor "NM4" at the gate thereof.

The size of the first additional nMOS transistor "NA1" is the same as that of the fourth nMOS transistor "NM4", for example.

The second additional nMOS transistor "NA2" is connected in parallel with the fifth nMOS transistor "NM5". That is, the second additional nMOS transistor "NA2" is connected to the source of the fifth nMOS transistor "NM5" at the source thereof, to the drain of the fifth nMOS transistor "NM5" at the drain thereof and to the gate of the fifth nMOS transistor "NM5" at the gate thereof.

The size of the second additional nMOS transistor "NA2" is the same as that of the fifth nMOS transistor "NM5", for example.

The third additional nMOS transistor "NA3" is connected in parallel with the seventh nMOS transistor "NM7". That is, the third additional nMOS transistor "NA3" is connected to the source of the seventh nMOS transistor "NM7" at the source thereof, to the drain of the seventh nMOS transistor "NM7" at the drain thereof and to the gate of the seventh nMOS transistor "NM7" at the gate thereof.

The size of the third additional nMOS transistor "NA3" is the same as that of the seventh nMOS transistor "NM7", for example.

Compared with the flip-flop circuit 100 according to the first embodiment, the flip-flop circuit 300 may further include at least one of the additional pMOS transistor "PA", the first additional nMOS transistor "NA1", the second additional nMOS transistor "NA2" and the third additional nMOS transistor "NA3".

The remainder of the configuration of the flip-flop circuit 300 is the same as that of the flip-flop circuit 100 according to the first embodiment shown in FIG. 2. That is, the master latch circuit "MRC" and the slave latch circuit "SRC" share some MOS transistors.

With the flip-flop circuit 100 shown in FIG. 2 described above, when a signal propagates from the master latch circuit "MRC" to the output terminal "TQ" via the intermediate node "A" after the clock signal "CP" changes, the tenth pMOS transistor "PM10" and the tenth nMOS transistor "NM10" function only as a feedback transistor for the master latch that constitutes a load on the intermediate node "A".

However, with the flip-flop circuit 300 shown in FIG. 5, the transistor driving strength of the slave latch circuit "SRC" increases, so that the delay time from the slave latch circuit "SRC" to the output terminal "TQ" decreases.

In addition, with the flip-flop circuit 300 shown in FIG. 5, the number of MOS transistors increases from 30 to 34. However, there are two shared MOS transistors, so that even if one of the shared transistors fails, the remaining one transistor normally operates. Therefore, the cell yield can be improved.

As described above, the flip-flop circuit according to the third embodiment can be improved in cell yield and in operation speed at the same time.

Fourth Embodiment

Figure 6:
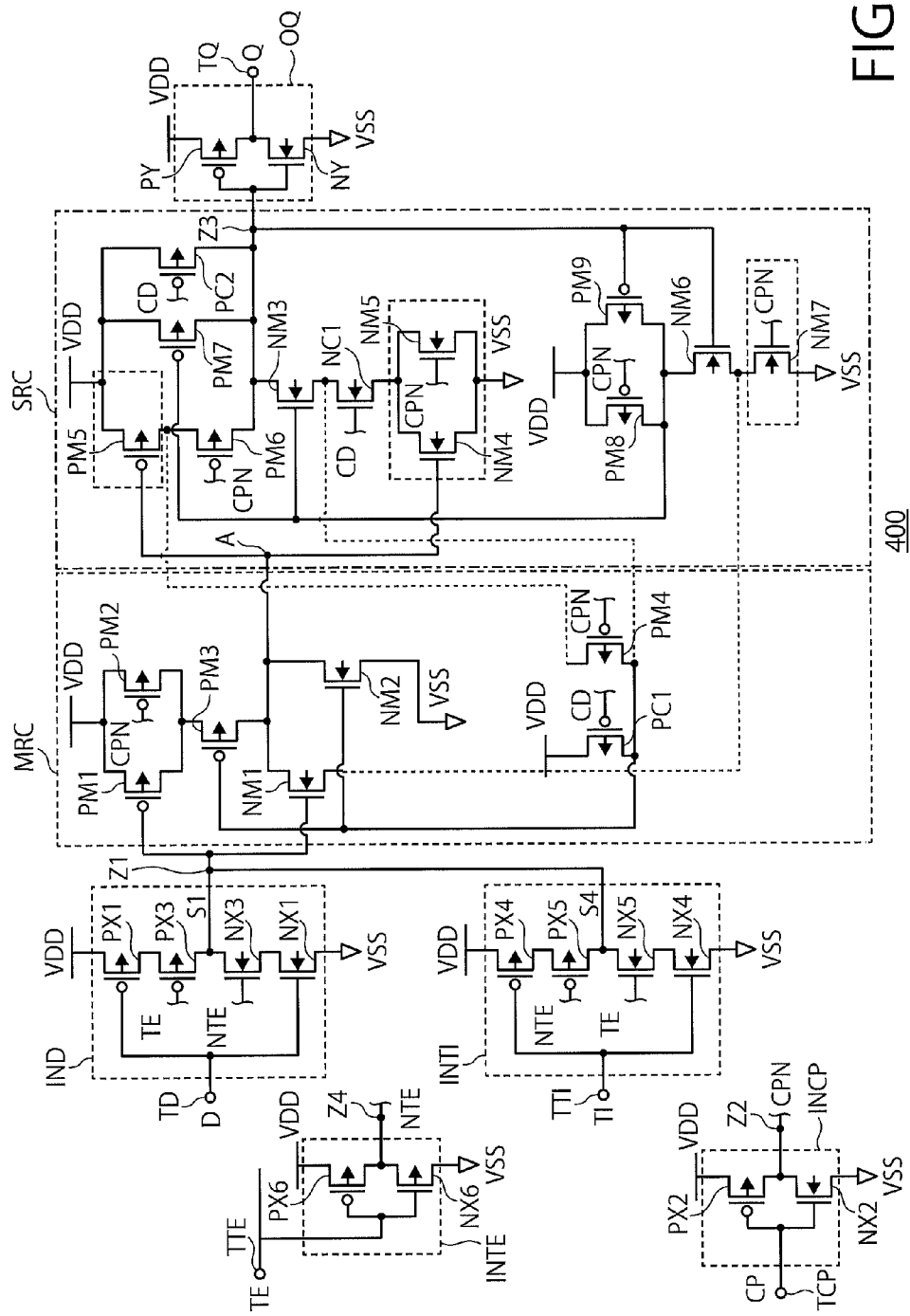
FIG. 6 is a diagram showing an example of a configuration of a flip-flop circuit 400 according to a fourth embodiment.

FIG. 6 is a diagram showing an example of a configuration of a flip-flop circuit 400 according to a fourth embodiment. In FIG. 6, the same reference symbols as those in FIG. 2 denote the same components as those according to the first embodiment.

As shown in FIG. 6, the flip-flop circuit 400 includes a master latch circuit "MRC", a slave latch circuit "SRC", a data terminal "TD", a clock terminal "TCP", an output terminal "TQ", a test terminal "TTI", a switching terminal "TTE", a test input circuit "INTI", a switching input circuit "INTE", a data input circuit "IND", a clock input circuit "INCP" and an output circuit "OQ".

In particular, as shown in FIG. 6, the flip-flop circuit 400 (the master latch circuit "MRC" and the slave latch circuit "SRC") according to the fourth embodiment differs from the flip-flop circuit 100 according to the first embodiment in that it further includes a first clearing pMOS transistor "PC1", a second clearing pMOS transistor "PC2" and a first clearing nMOS transistor "NC1".

The first clearing pMOS transistor "PC1" is connected to the power supply "VDD" at the source thereof and to the gates of the third pMOS transistor "PM3" and the second nMOS transistor "NM2", the drain of the fourth pMOS transistor "PM4" and the source of the third nMOS transistor "NM3" at the drain thereof, and is supplied with a clearing signal "CD" at the gate thereof.

The second clearing pMOS transistor "PC2" is connected to the power supply "VDD" at the source thereof and to the third node "Z3" and the drains of the sixth pMOS transistor "PM6", the seventh pMOS transistor "PM7" and the third nMOS transistor "NM3" at the drain thereof, and is supplied with the clearing signal "CD" at the gate thereof.

The first clearing nMOS transistor "NC1" is connected to the source of the third nMOS transistor "NM3", the drains of the fourth pMOS transistor "PM4" and the first clearing pMOS transistor "PC1" and the gates of the third pMOS transistor "PM3" and the second nMOS transistor "NM2" at the drain thereof and to the drains of the fourth nMOS transistor "NM4" and the fifth nMOS transistor "NM5" at the source thereof, and is supplied with the clearing signal "CD" at the gate thereof.

The remainder of the configuration of the flip-flop circuit 400 is the same as that of the flip-flop circuit 100 according to the first embodiment shown in FIG. 2. That is, the master latch circuit "MRC" and the slave latch circuit "SRC" share some MOS transistors.

Therefore, the flip-flop circuit 400 can be reduced in cell size compared with the flip-flop circuit according to the comparative example shown in FIG. 1 additionally including a clearing circuit, as with the flip-flop circuit according to the first embodiment.

An example of an operation of the flip-flop circuit 400 according to the fourth embodiment configured as described above in response to the clearing signal "CD" will be described.

For example, if the clearing signal "CD" is at the "High" level, the first clearing pMOS transistor "PC1" and the second clearing pMOS transistor "PC2" are turned off, and the first clearing nMOS transistor "NC1" is turned on.

In this case, the flip-flop circuit 400 performs the same flip-flop operation as the flip-flop circuit 100 according to the first embodiment described earlier.

On the other hand, if the clearing signal is at the "Low" level, the first clearing pMOS transistor "PC1" and the second clearing pMOS transistor "PC2" are turned on, and the first clearing nMOS transistor "NC1" is turned off.

As a result, the drain of the first clearing pMOS transistor "PC1" is set at the "High" level regardless of the data signal "D" and the clock signal "CP". And the third pMOS transistor "PM3" is turned off, and the second nMOS transistor "NM2" is turned on.

Therefore, the intermediate node "A" is always kept at the "Low" level.

Furthermore, the drain of the second clearing pMOS transistor "PC2" is set at the "High" level regardless of the data signal "D" and the clock signal "CP". And the first clearing nMOS transistor "NC1" is turned off.

As a result, the drain of the third nMOS transistor "NM3" is set at the "High" level regardless of the gate inputs of the third nMOS transistor "NM3", the fourth nMOS transistor "NM4" and the fifth nMOS transistor "NM5".

Therefore, the third node "Z3" is at the "High" level, and the output signal "Q" is at the "Low" level.

As described above, the flip-flop circuit 400 is configured so that the output signal "Q" is controlled to be at the "Low" level when the clearing signal "CD" is at the "Low" level.

In addition, as described above, the flip-flop circuit 400 according to the fourth embodiment differs from the flip-flop circuit 100X according to the comparative example in that the master latch circuit "MRC" and the slave latch circuit "SRC" share some MOS transistors.

In particular, according to the fourth embodiment, as in the first embodiment, MOS transistors which have gate inputs at the intermediate node "A", at which the master latch circuit and the slave latch circuit are connected to each other, and constitute loads, are two MOS transistors such as the fifth pMOS transistor "PM5" and the fourth nMOS transistor "NM4". Thus, according to the fourth embodiment, the number of the MOS transistors constituting loads is reduced compared with the comparative example.

Thus, in response to the clock signal "CP", the signal held in the master latch circuit "MRC" can be output at higher speed as the output signal "Q" via the intermediate node "A", the slave latch circuit "SRC" and the output circuit.

As described above, the flip-flop circuit according to the fourth embodiment can have a clearing circuit and be reduced in cell size and improved in processing speed as in the first embodiment.

In addition, as described above the third embodiment, the flip-flop circuit 400 may further include at least one of the additional pMOS transistor "PA", the first additional nMOS transistor "NA1", the second additional nMOS transistor "NA2" and the third additional nMOS transistor "NA3".

There are two shared MOS transistors, so that even if one of the shared transistors fails, the remaining one transistor normally operates. Therefore, the cell yield can be improved.

Fifth Embodiment

Figure 7:
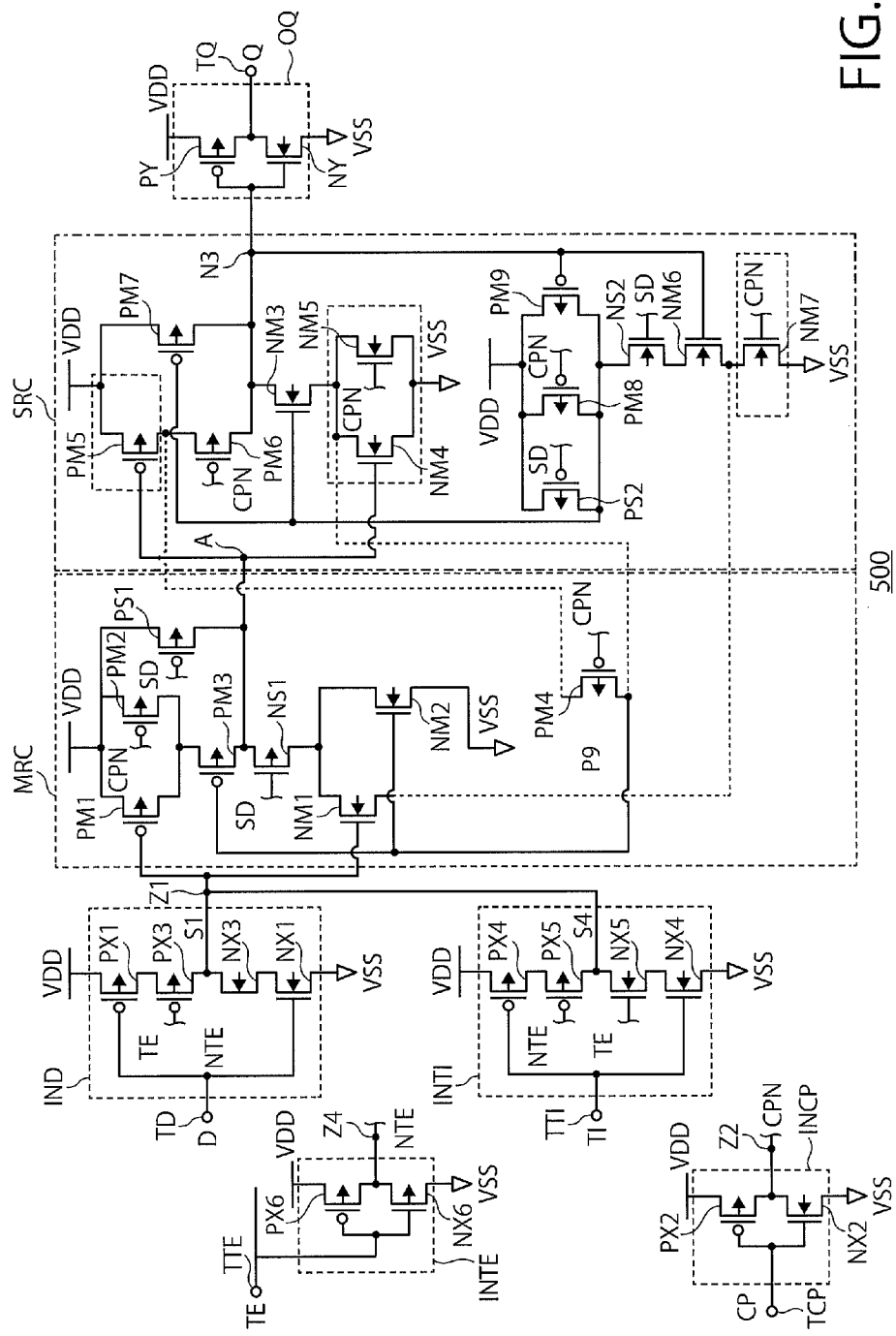
FIG. 7 is a diagram showing an example of a configuration of a flip-flop circuit 500 according to a fifth embodiment.

FIG. 7 is a diagram showing an example of a configuration of a flip-flop circuit 500 according to a fifth embodiment. In FIG. 7, the same reference symbols as those in FIG. 2 denote the same components as those according to the first embodiment.

As shown in FIG. 7, the flip-flop circuit 500 includes a master latch circuit "MRC", a slave latch circuit "SRC", a data terminal "TD", a clock terminal "TCP", an output terminal "TQ", a test terminal "TTI", a switching terminal "TTE", a test input circuit "INTI", a switching input circuit "INTE", a data input circuit "IND", a clock input circuit "INCP" and an output circuit "OQ".

In particular, as shown in FIG. 7, the flip-flop circuit 500 (the master latch circuit "MRC" and the slave latch circuit "SRC") according to the fifth embodiment differs from the flip-flop circuit 100 according to the first embodiment in that it further includes a first setting pMOS transistor "PS1", a first setting nMOS transistor "NS1", a second setting pMOS transistor "PS2" and a second setting nMOS transistor "NS2".

The first setting pMOS transistor "PS1" is connected to the power supply "VDD" at the source thereof and to the intermediate node "A" and the drain of the third pMOS transistor "PM3" at the drain thereof and is supplied with a setting signal "SD" at the gate thereof.

The first setting nMOS transistor "NS1" is connected to the intermediate node "A" and the drains of the third pMOS transistor "PM3" and the first setting pMOS transistor "PS1" at the drain thereof and to the drains of the first nMOS transistor "NM1" and the second nMOS transistor "NM2" at the source thereof, and is supplied with the setting signal "SD" at the gate thereof.

The second setting pMOS transistor "PS2" is connected to the power supply "VDD" at the source thereof and to the gates of the seventh pMOS transistor "PM7" and the third nMOS transistor "NM3" and the drains of the eighth pMOS transistor "PM8" and the ninth pMOS transistor "PM9" at the drain thereof, and is supplied with the setting signal "SD" at the gate thereof.

The second setting nMOS transistor "NS2" is connected to the gates of the seventh pMOS transistor "PM7" and the third nMOS transistor "NM3" and the drains of the eighth pMOS transistor "PM8", the ninth pMOS transistor "PM9" and the second setting pMOS transistor "PS2" at the drain thereof and to the drain of the sixth nMOS transistor "NM6" at the source thereof, and is supplied with the setting signal "SD" at the gate thereof.

The remainder of the configuration of the flip-flop circuit 500 is the same as that of the flip-flop circuit 100 according to the first embodiment shown in FIG. 2. That is, the master latch circuit "MRC" and the slave latch circuit "SRC" share some MOS transistors.

Therefore, the flip-flop circuit 500 can be reduced in cell size compared with the flip-flop circuit according to the comparative example shown in FIG. 1 additionally including a setting circuit, as with the flip-flop circuit according to the first embodiment.

An example of an operation of the flip-flop circuit 500 according to the fifth embodiment configured as described above in response to the setting signal "SD" will be described.

For example, if the setting signal "SD" is at the "High" level, the first setting pMOS transistor "PS1" and the second setting pMOS transistor "PS2" are turned off, and the first setting nMOS transistor "NS1" and the second setting nMOS transistor "NS2" are turned on.

In this case, the flip-flop circuit 500 performs the same flip-flop operation as the flip-flop circuit 100 according to the first embodiment described earlier.

On the other hand, if the setting signal "SD" is at the "Low" level, the first setting pMOS transistor "PS1" and the second setting pMOS transistor "PS2" are turned on, and the first setting nMOS transistor "NS1" and the second setting nMOS transistor "NS2" are turned off.

As a result, the drain of the first setting pMOS transistor "PS1" in the master latch circuit "MRC", that is, the intermediate node "A", is always at the "High" level.

In the slave latch circuit "SRC", since the intermediate node "A" is at the "High" level, the fifth pMOS transistor "PM5" is turned off, the fourth nMOS transistor "NM4" is turned on, and the second setting pMOS transistor "PS2" is turned on.

As a result, the seventh pMOS transistor "PM7" is turned off, and the third nMOS transistor "NM3" is turned on.

Therefore, the third node "Z3" is at the "Low" level, and the output signal "Q" is at the "High" level.

As described above, the flip-flop circuit 500 is configured so that the output signal "Q" is controlled to be at the "High" level when the setting signal "SD" is at the "Low" level.

In addition, as described above, the flip-flop circuit 500 according to the fifth embodiment differs from the flip-flop circuit 100X according to the comparative example in that the master latch circuit "MRC" and the slave latch circuit "SRC" share some MOS transistors.

In particular, according to the fifth embodiment, as in the first embodiment, two MOS transistors, the fifth pMOS transistor "PM5" and the fourth nMOS transistor "NM4", are connected at the gates thereof to the intermediate node "A", at which the master latch circuit and the slave latch circuit are connected to each other, and constitute loads. Thus, according to the fifth embodiment, the number of the MOS transistors constituting loads is reduced compared with the comparative example.

Thus, the output signal "Q" can be output at higher speed in response to the clock signal "CP".

As described above, the flip-flop circuit according to the fifth embodiment can be reduced in cell size and improved in processing speed, as in the first embodiment.

In addition, as described above the third embodiment, the flip-flop circuit 500 may further include at least one of the additional pMOS transistor "PA", the first additional nMOS transistor "NA1", the second additional nMOS transistor "NA2" and the third additional nMOS transistor "NA3".

There are two shared MOS transistors, so that even if one of the shared transistors fails, the remaining one transistor normally operates. Therefore, the cell yield can be improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A flip-flop circuit, comprising:
a first pMOS transistor connected to a power supply at a source thereof and to a first node at a gate thereof, a first signal based on a data signal being supplied to the first node;
a second pMOS transistor connected to the power supply at a source thereof and to a second node at a gate thereof, a second signal based on a clock signal being supplied to the second node;
a third pMOS transistor connected to drains of the first and second pMOS transistors at a source thereof and to an intermediate node, at which a master latch and a slave latch are connected to each other, at a drain thereof;
a first nMOS transistor connected to the intermediate node and the drain of the third pMOS transistor at a drain thereof and to the first node at a gate thereof;
a second nMOS transistor connected to the intermediate node and the drains of the third pMOS transistor and the first nMOS transistor at a drain thereof, to a ground at a source thereof and to a gate of the third pMOS transistor at a gate thereof;
a fourth pMOS transistor connected to the gate of the third pMOS transistor and the gate of the second nMOS transistor at a drain thereof and to the second node at a gate thereof;

a fifth pMOS transistor connected to the power supply at a source thereof and to the intermediate node at a gate thereof;

a sixth pMOS transistor connected to a drain of the fifth pMOS transistor at a source thereof, to a third node at a drain thereof and to the second node at a gate thereof, a third signal of the slave latch being supplied to the third node;

a seventh pMOS transistor connected to the power supply at a source thereof and to the third node and the drain of the sixth pMOS transistor at a drain thereof;

a third nMOS transistor connected to the third node and the drains of the sixth and seventh pMOS transistors at a drain thereof and to a gate of the seventh pMOS transistor at a gate thereof;

a fourth nMOS transistor connected to a source of the third nMOS transistor at a drain thereof, to the ground at a source thereof and to the intermediate node at a gate thereof;

a fifth nMOS transistor connected to the source of the third nMOS transistor and the drain of the fourth nMOS transistor at a drain thereof, to the ground at a source thereof and to the second node at a gate thereof;

an eighth pMOS transistor connected to the power supply at a source thereof, to the gate of the seventh pMOS transistor and the gate of the third nMOS transistor at a drain thereof and to the second node at a gate thereof;

a ninth pMOS transistor connected to the power supply at a source thereof, to the gates of the seventh pMOS transistor and the third nMOS transistor and the drain of the eighth pMOS transistor at a drain thereof and to the third node at a gate thereof;

a sixth nMOS transistor connected to the gates of the seventh pMOS transistor and the third nMOS transistor and the drains of the eighth and ninth pMOS transistors at a drain thereof and to the third node at a gate thereof; and a seventh nMOS transistor connected to a source of the sixth nMOS transistor at a drain thereof, to the ground at a source thereof and to the second node at a gate thereof, wherein an output signal is output based on the third signal at the third node, a source of the first nMOS transistor is connected to the source of the sixth nMOS transistor and the drain of the seventh nMOS transistor, a source of the fourth pMOS transistor is connected to the drain of the fifth pMOS transistor and the source of the sixth pMOS transistor, and the drain of the fourth pMOS transistor is connected to the source of the third nMOS transistor and the drains of the fourth and fifth nMOS transistors.

2. The flip-flop circuit according to claim 1, further comprising:

a data terminal to which the data signal is supplied;

a clock terminal to which the clock signal is supplied;

an output terminal at which the output signal is output;

a data input circuit that is supplied with the data signal via the data terminal and outputs the first signal to the first node;

a clock input circuit that is supplied with the clock signal via the clock terminal and outputs the second signal to the second node; and an output circuit that is supplied with the third signal via the third node and outputs the output signal to the output terminal.

3. The flip-flop circuit according to claim 1, further comprising:

a test terminal to which a scan test data signal is supplied;

a switching terminal to which a switching signal is supplied;

a test input circuit that is supplied with the scan test data signal via the test terminal and outputs a fourth signal based on the scan test data signal to the first node; and a switching input circuit that is supplied with the switching signal via the switching terminal and outputs a fifth signal based on the switching signal to a fourth node, wherein only one of the first signal output from a data input circuit and the fourth signal output from the test input circuit is supplied to the first node depending on the switching signal and the fifth signal.

4. The flip-flop circuit according to claim 1, further comprising at least one of:

an additional pMOS transistor connected to the source of the fifth pMOS transistor at a source thereof, to the drain of the fifth pMOS transistor at a drain thereof and to the gate of the fifth pMOS transistor at a gate thereof;

a first additional nMOS transistor connected to the source of the fourth nMOS transistor at a source thereof, to the drain of the fourth nMOS transistor at a drain thereof and to the gate of the fourth nMOS transistor at a gate thereof;

a second additional nMOS transistor connected to the source of the fifth nMOS transistor at a source thereof, to the drain of the fifth nMOS transistor at a drain thereof and to the gate of the fifth nMOS transistor at a gate thereof, and a third additional nMOS transistor connected to the source of the seventh nMOS transistor at a source thereof, to the drain of the seventh nMOS transistor at a drain thereof and to the gate of the seventh nMOS transistor at a gate thereof.

5. The flip-flop circuit according to claim 4, wherein:

a size of the additional pMOS transistor is the same as that of the fifth pMOS transistor;

a size of the first additional nMOS transistor is the same as that of the fourth nMOS transistor;

a size of the second additional nMOS transistor is the same as that of the fifth nMOS transistor, and a size of the third additional nMOS transistor is the same as that of the seventh nMOS transistor.

6. The flip-flop circuit according to claim 1, further comprising:

a first clearing pMOS transistor connected to the power supply at a source thereof and to the gates of the third pMOS transistor and the second nMOS transistor, the drain of the fourth pMOS transistor and the source of the third nMOS transistor at a drain thereof and supplied with a clearing signal at a gate thereof;

a second clearing pMOS transistor connected to the power supply at a source thereof and to the third node and the drains of the sixth and seventh pMOS transistors and the third nMOS transistor at a drain thereof and supplied with the clearing signal at a gate thereof; and a first clearing nMOS transistor connected to the source of the third nMOS transistor, the gates of the third pMOS transistor and the second nMOS transistor and the drains of the fourth pMOS transistor and the first clearing pMOS transistor at a drain thereof and to the drains of the fourth and fifth nMOS transistors at a source thereof and supplied with the clearing signal at a gate thereof.

7. The flip-flop circuit according to claim 1, further comprising:

a first setting pMOS transistor connected to the power supply at a source thereof and to the intermediate node and the drain of the third pMOS transistor at a drain thereof and supplied with a setting signal at a gate thereof;

a first setting nMOS transistor connected to the intermediate node and the drains of the third pMOS transistor and the first setting pMOS transistor at a drain thereof and to the drains of the first and second nMOS transistors at a source thereof and supplied with the setting signal at a gate thereof;

a second setting pMOS transistor connected to the power supply at a source thereof and to the gates of the seventh pMOS transistor and the third nMOS transistor and the drains of the eighth and ninth pMOS transistors at a drain thereof and supplied with the setting signal at a gate thereof; and a second setting nMOS transistor connected to the gates of the seventh pMOS transistor and the third nMOS transistor and the drains of the eighth and ninth pMOS transistors and the second setting pMOS transistor at a drain thereof and to the drain of the sixth nMOS transistor at a source thereof and supplied with the setting signal at a gate thereof.

8. The flip-flop circuit according to claim 1,
wherein the first signal is an inverted signal of the data signal,
wherein the second signal is an inverted signal of the clock signal,
wherein the output signal is an inverted signal of the third signal.

9. The flip-flop circuit according to claim 6, further comprising at least one of:
an additional pMOS transistor connected to the source of the fifth pMOS transistor at a source thereof, to the drain of the fifth pMOS transistor at a drain thereof and to the gate of the fifth pMOS transistor at a gate thereof;
a first additional nMOS transistor connected to the source of the fourth nMOS transistor at a source thereof, to the drain of the fourth nMOS transistor at a drain thereof and to the gate of the fourth nMOS transistor at a gate thereof;
a second additional nMOS transistor connected to the source of the fifth nMOS transistor at a source thereof, to the drain of the fifth nMOS transistor at a drain thereof and to the gate of the fifth nMOS transistor at a gate thereof; and
a third additional nMOS transistor connected to the source of the seventh nMOS transistor at a source thereof, to the drain of the seventh nMOS transistor at a drain thereof and to the gate of the seventh nMOS transistor at a gate thereof.

10. The flip-flop circuit according to claim 7, further comprising at least one of:
an additional pMOS transistor connected to the source of the fifth pMOS transistor at a source thereof, to the drain of the fifth pMOS transistor at a drain thereof and to the gate of the fifth pMOS transistor at a gate thereof;
a first additional nMOS transistor connected to the source of the fourth nMOS transistor at a source thereof, to the drain of the fourth nMOS transistor at a drain thereof and to the gate of the fourth nMOS transistor at a gate thereof;
a second additional nMOS transistor connected to the source of the fifth nMOS transistor at a source thereof, to the drain of the fifth nMOS transistor at a drain thereof and to the gate of the fifth nMOS transistor at a gate thereof; and a third additional nMOS transistor connected to the source of the seventh nMOS transistor at a source thereof, to the drain of the seventh nMOS transistor at a drain thereof and to the gate of the seventh nMOS transistor at a gate thereof.

11. A flip-flop circuit, comprising:
a first pMOS transistor connected to a power supply at a source thereof and to a first node at a gate thereof, a first signal based on a data signal being supplied to the first node;
a second pMOS transistor connected to the power supply at a source thereof and to a second node at a gate thereof, a second signal based on a clock signal being supplied to the second node;
a third pMOS transistor connected to drains of the first and second pMOS transistors at a source thereof and to an intermediate node, at which a master latch and a slave latch are connected to each other, at a drain thereof;
a first nMOS transistor connected to the intermediate node and the drain of the third pMOS transistor at a drain thereof and to the first node at a gate thereof;
a second nMOS transistor connected to the intermediate node and the drains of the third pMOS transistor and the first nMOS transistor at a drain thereof, to a ground at a source thereof and to a gate of the third pMOS transistor at a gate thereof;
a fourth pMOS transistor connected to the gate of the third pMOS transistor and the gate of the second nMOS transistor at a drain thereof and to the second node at a gate thereof;
a fifth pMOS transistor connected to the power supply at a source thereof and to the intermediate node at a gate thereof;
a sixth pMOS transistor connected to a drain of the fifth pMOS transistor at a source thereof, to a third node at a drain thereof and to the second node at a gate thereof, a third signal of the slave latch being supplied to the third node;
a seventh pMOS transistor connected to the power supply at a source thereof and to the third node and the drain of the sixth pMOS transistor at a drain thereof;
a third nMOS transistor connected to the third node and the drains of the sixth and seventh pMOS transistors at a drain thereof and to a gate of the seventh pMOS transistor at a gate thereof;
a fourth nMOS transistor connected to a source of the third nMOS transistor at a drain thereof, to the ground at a source thereof and to the intermediate node at a gate thereof;
a fifth nMOS transistor connected to the source of the third nMOS transistor and the drain of the fourth nMOS transistor at a drain thereof, to the ground at a source thereof and to the second node at a gate thereof;
an eighth pMOS transistor connected to the power supply at a source thereof, to the gate of the seventh pMOS transistor and the gate of the third nMOS transistor at a drain thereof and to the second node at a gate thereof;
a ninth pMOS transistor connected to the power supply at a source thereof, to the gates of the seventh pMOS transistor and the third nMOS transistor and the drain of the eighth pMOS transistor at a drain thereof and to the third node at a gate thereof;
a sixth nMOS transistor connected to the gates of the seventh pMOS transistor and the third nMOS transistor and the drains of the eighth and ninth pMOS transistors at a drain thereof and to the third node at a gate thereof; and a seventh nMOS transistor connected to a source of the sixth nMOS transistor at a drain thereof, to the ground at a source thereof and to the second node at a gate thereof;

wherein the output signal is output based on the third signal at the third node, wherein the flip-flop circuit has at least one of:

a configuration in which a source of the first nMOS transistor is connected to the source of the sixth nMOS transistor and the drain of the seventh nMOS transistor, a configuration in which a source of the fourth pMOS transistor is connected to the drain of the fifth pMOS transistor and the source of the sixth pMOS transistor, and a configuration in which the drain of the fourth pMOS transistor is connected to the source of the third nMOS transistor and the drains of the fourth and fifth nMOS transistors, wherein in a case in which the flip-flop circuit does not have a configuration in which the source of the first nMOS transistor is connected to the source of the sixth nMOS transistor and the drain of the seventh nMOS transistor, the flip-flop circuit has a configuration in which the source of the first nMOS transistor is connected to a drain of an eighth nMOS transistor which is connected to the ground at a source thereof and to the second node at a gate thereof, wherein in a case in which the flip-flop circuit does not have a configuration in which the source of the fourth pMOS transistor is connected to the drain of the fifth pMOS transistor and the source of the sixth pMOS transistor, the flip-flop circuit has a configuration in which the source of the fourth pMOS transistor is connected to a drain of a tenth pMOS transistor which is connected to the power supply at a source thereof, and to the gate of the fourth nMOS transistor and the intermediate node at a gate thereof, and wherein in a case in which the flip-flop circuit does not have a configuration in which the drain of the fourth pMOS transistor is connected to the source of the third nMOS transistor and the drains of the fourth and fifth nMOS transistors, the flip-flop circuit has a configuration in which the drain of the fourth pMOS transistor is connected to a drain of a ninth nMOS transistor and a drain of a tenth nMOS transistor, the ninth nMOS transistor being connected to the ground at a source thereof and to the second node at a gate thereof, and the tenth nMOS transistor being connected to the ground at a source thereof, and to the gate of the fifth pMOS transistor and the intermediate node at a gate thereof.

12. The flip-flop circuit according to claim 11, further comprising:

a data terminal supplied with the data signal;

a clock terminal supplied with a clock signal;

a output terminal that outputs an output signal;

a data input circuit that is supplied with the data signal via the data terminal and outputs the first signal to the first node;

a clock input circuit that is supplied with the clock signal via the clock terminal and outputs the second signal to the second node; and an output circuit that is supplied with the third signal via the third node and outputs the output signal to the output terminal.

13. The flip-flop circuit according to claim 11, further comprising:

a test terminal to which a scan test data signal is supplied;

a switching terminal to which a switching signal is supplied;

a test input circuit that is supplied with the scan test data signal via the test terminal and outputs a fourth signal based on the scan test data signal to the first node; and a switching input circuit that is supplied with the switching signal via the switching terminal and outputs a fifth signal based on the switching signal to a fourth node, wherein only one of the first signal output from a data input circuit and the fourth signal output from the test input circuit is supplied to the first node depending on the switching signal and the fifth signal.

14. The flip-flop circuit according to claim 11, further comprising at least one of:

an additional pMOS transistor connected to the source of the fifth pMOS transistor at a source thereof, to the drain of the fifth pMOS transistor at a drain thereof and to the gate of the fifth pMOS transistor at a gate thereof;

a first additional nMOS transistor connected to the source of the fourth nMOS transistor at a source thereof, to the drain of the fourth nMOS transistor at a drain thereof and to the gate of the fourth nMOS transistor at a gate thereof;

a second additional nMOS transistor connected to the source of the fifth nMOS transistor at a source thereof, to the drain of the fifth nMOS transistor at a drain thereof and to the gate of the fifth nMOS transistor at a gate thereof; and a third additional nMOS transistor connected to the source of the seventh nMOS transistor at a source thereof, to the drain of the seventh nMOS transistor at a drain thereof and to the gate of the seventh nMOS transistor at a gate thereof.

15. The flip-flop circuit according to claim 14, wherein:

a size of the additional pMOS transistor is the same as that of the fifth pMOS transistor;

a size of the first additional nMOS transistor is the same as that of the fourth nMOS transistor;

a size of the second additional nMOS transistor is the same as that of the fifth nMOS transistor, and a size of the third additional nMOS transistor is the same as that of the seventh nMOS transistor.

16. The flip-flop circuit according to claim 11, further comprising:

a first clearing pMOS transistor connected to the power supply at a source thereof and to the gates of the third pMOS transistor and the second nMOS transistor, the drain of the fourth pMOS transistor and the source of the third nMOS transistor at a drain thereof and supplied with a clearing signal at a gate thereof;

a second clearing pMOS transistor connected to the power supply at a source thereof and to the third node and the drains of the sixth and seventh pMOS transistors and the third nMOS transistor at a drain thereof and supplied with the clearing signal at a gate thereof; and a first clearing nMOS transistor connected to the source of the third nMOS transistor, the gates of the third pMOS transistor and the second nMOS transistor and the drains of the fourth pMOS transistor and the first clearing pMOS transistor at a drain thereof and to the drains of the fourth and fifth nMOS transistors at a source thereof and supplied with the clearing signal at a gate thereof.

17. The flip-flop circuit according to claim 11, further comprising:

a first setting pMOS transistor connected to the power supply at a source thereof and to the intermediate node and the drain of the third pMOS transistor at a drain thereof and supplied with a setting signal at a gate thereof;

a first setting nMOS transistor connected to the intermediate node and the drains of the third pMOS transistor and the first setting pMOS transistor at a drain thereof and to the drains of the first and second nMOS transistors at a source thereof and supplied with the setting signal at a gate thereof;

a second setting pMOS transistor connected to the power supply at a source thereof and to the gates of the seventh pMOS transistor and the third nMOS transistor and the drains of the eighth and ninth pMOS transistors at a drain thereof and supplied with the setting signal at a gate thereof; and a second setting nMOS transistor connected to the gates of the seventh pMOS transistor and the third nMOS transistor and the drains of the eighth and ninth pMOS transistors and the second setting pMOS transistor at a drain thereof and to the drain of the sixth nMOS transistor at a source thereof and supplied with the setting signal at a gate thereof.

18. The flip-flop circuit according to claim 11,
wherein the first signal is an inverted signal of the data signal,
wherein the second signal is an inverted signal of the clock signal,
wherein the output signal is an inverted signal of the third signal.

19. The flip-flop circuit according to claim 16, further comprising at least one of:
an additional pMOS transistor connected to the source of the fifth pMOS transistor at a source thereof, to the drain of the fifth pMOS transistor at a drain thereof and to the gate of the fifth pMOS transistor at a gate thereof;
a first additional nMOS transistor connected to the source of the fourth nMOS transistor at a source thereof, to the drain of the fourth nMOS transistor at a drain thereof and to the gate of the fourth nMOS transistor at a gate thereof;
a second additional nMOS transistor connected to the source of the fifth nMOS transistor at a source thereof, to the drain of the fifth nMOS transistor at a drain thereof and to the gate of the fifth nMOS transistor at a gate thereof; and
a third additional nMOS transistor connected to the source of the seventh nMOS transistor at a source thereof, to the drain of the seventh nMOS transistor at a drain thereof and to the gate of the seventh nMOS transistor at a gate thereof.

20. The flip-flop circuit according to claim 17, further comprising at least one of:
an additional pMOS transistor connected to the source of the fifth pMOS transistor at a source thereof, to the drain of the fifth pMOS transistor at a he drain thereof and to the gate of the fifth pMOS transistor at a gate thereof;
a first additional nMOS transistor connected to the source of the fourth nMOS transistor at a source thereof, to the drain of the fourth nMOS transistor at a drain thereof and to the gate of the fourth nMOS transistor at a gate thereof;
a second additional nMOS transistor connected to the source of the fifth nMOS transistor at a source thereof, to the drain of the fifth nMOS transistor at a drain thereof and to the gate of the fifth nMOS transistor at a gate thereof; and
a third additional nMOS transistor connected to the source of the seventh nMOS transistor at a source thereof, to the drain of the seventh nMOS transistor at a drain thereof and to the gate of the seventh nMOS transistor at a gate thereof.

* * * * *